US012568626B2

(12) United States Patent
Nishikawa

(10) Patent No.: US 12,568,626 B2
(45) Date of Patent: Mar. 3, 2026

(54) SEMICONDUCTOR MEMORY DEVICE

(71) Applicant: Kioxia Corporation, Tokyo (JP)

(72) Inventor: Takuya Nishikawa, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 377 days.

(21) Appl. No.: 18/461,827

(22) Filed: Sep. 6, 2023

(65) Prior Publication Data

US 2024/0196615 A1 Jun. 13, 2024

(30) Foreign Application Priority Data

Dec. 8, 2022 (JP) ................................ 2022-196580

(51) Int. Cl.
 *H10B 43/27* (2023.01)
 *H10B 41/10* (2023.01)
 *H10B 41/27* (2023.01)
 *H10B 43/10* (2023.01)
(52) U.S. Cl.
 CPC ............. *H10B 43/27* (2023.02); *H10B 41/10* (2023.02); *H10B 41/27* (2023.02); *H10B 43/10* (2023.02)
(58) Field of Classification Search
 CPC ........ H10B 43/27; H10B 43/10; H10B 41/10; H10B 41/27
 See application file for complete search history.

(56) References Cited

U.S. PATENT DOCUMENTS

2022/0093633 A1 3/2022 Ishiduki
2024/0038577 A1* 2/2024 Manthena ......... H01L 21/76224

FOREIGN PATENT DOCUMENTS

CN 116487363 * 7/2023
JP 2022-051289 A 3/2022

* cited by examiner

*Primary Examiner* — Matthew L Reames
(74) *Attorney, Agent, or Firm* — Foley & Lardner LLP

(57) ABSTRACT

A semiconductor memory device includes finger structures arranged in a first direction and an inter-finger insulating member disposed between a first finger structure and a second finger structure. The first finger structure includes conductive layers stacked in a stacking direction, a semiconductor column opposed to the conductive layers, a first insulating layer and a second insulating layer covering terrace portions of the conductive layers, and a third insulating layer disposed between the first insulating layer and the inter-finger insulating member in the first direction. The second insulating layer and the third insulating layer have mutually same main components. At least a part of a main component of the first insulating layer is different from the main components of the second insulating layer and the third insulating layer. The second insulating layer and the third insulating layer have mutually different etching rates.

20 Claims, 38 Drawing Sheets

110A
101
110A
101
110A
101
110A
101
110A
101
110A
101
110A
101
110A 101
110A
101
110A
101
110A
101
110A
101
110A
101
110A
101
110A
101
110A
101

112E
112D
112C
112B
112A

101

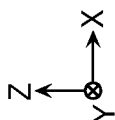
FIG. 11
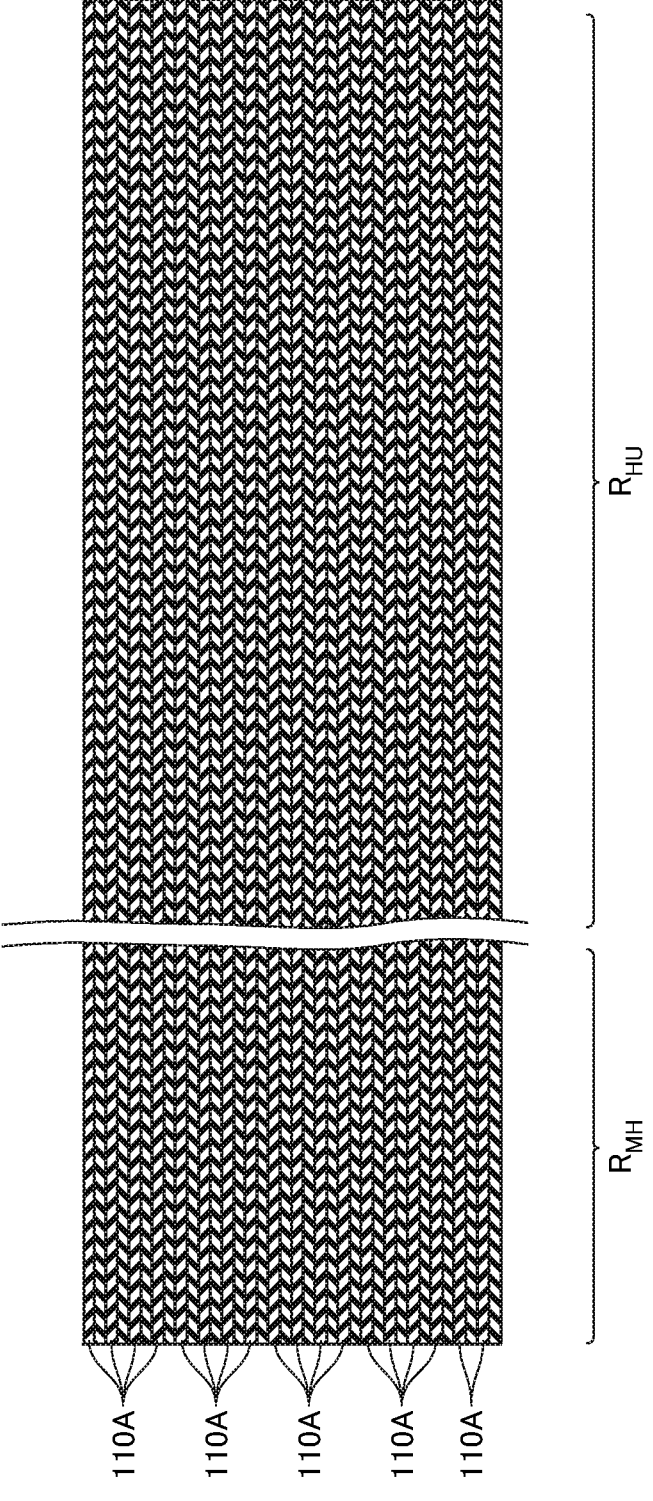

110A
101
110A
101

110A
101
110A
101
110A
101
110A

102

110A
101
110A
101
110A
101
110A
101
110A
101
110A
101
110A
101
110A
101

120A 112E
112D
112C
112B
112A 120B     120B     120B

101

102

110A
101
110A
101
110A
101
110A
101
110A
101
110A
101
110A
110A

121

101
110A
101
110A
101
110A
101
110A
101
110A
101
110A
101
110A
101
110A
101

120

130
125

112E
112D
112C
112B
112A 120B        120B        120B

101

SEMICONDUCTOR MEMORY DEVICE

CROSS-REFERENCE TO RELATED APPLICATIONS

This application is based upon and claims the benefit of Japanese Patent Application No. 2022-196580, filed on Dec. 8, 2022, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers stacked in a stacking direction intersecting with a surface of this substrate, a semiconductor column opposed to these plurality of conductive layers, and a gate insulating film disposed between the plurality of conductive layers and the semiconductor column. The gate insulating film includes a memory portion that can store data, and the memory portion is, for example, an insulating electric charge accumulating film of silicon nitride (SiN) or the like, or a conductive electric charge accumulating film, such as a floating gate.

BRIEF DESCRIPTION OF THE DRAWINGS

FIG. 11 is a schematic cross-sectional view illustrating the same manufacturing method;

DETAILED DESCRIPTION

Figure 1:
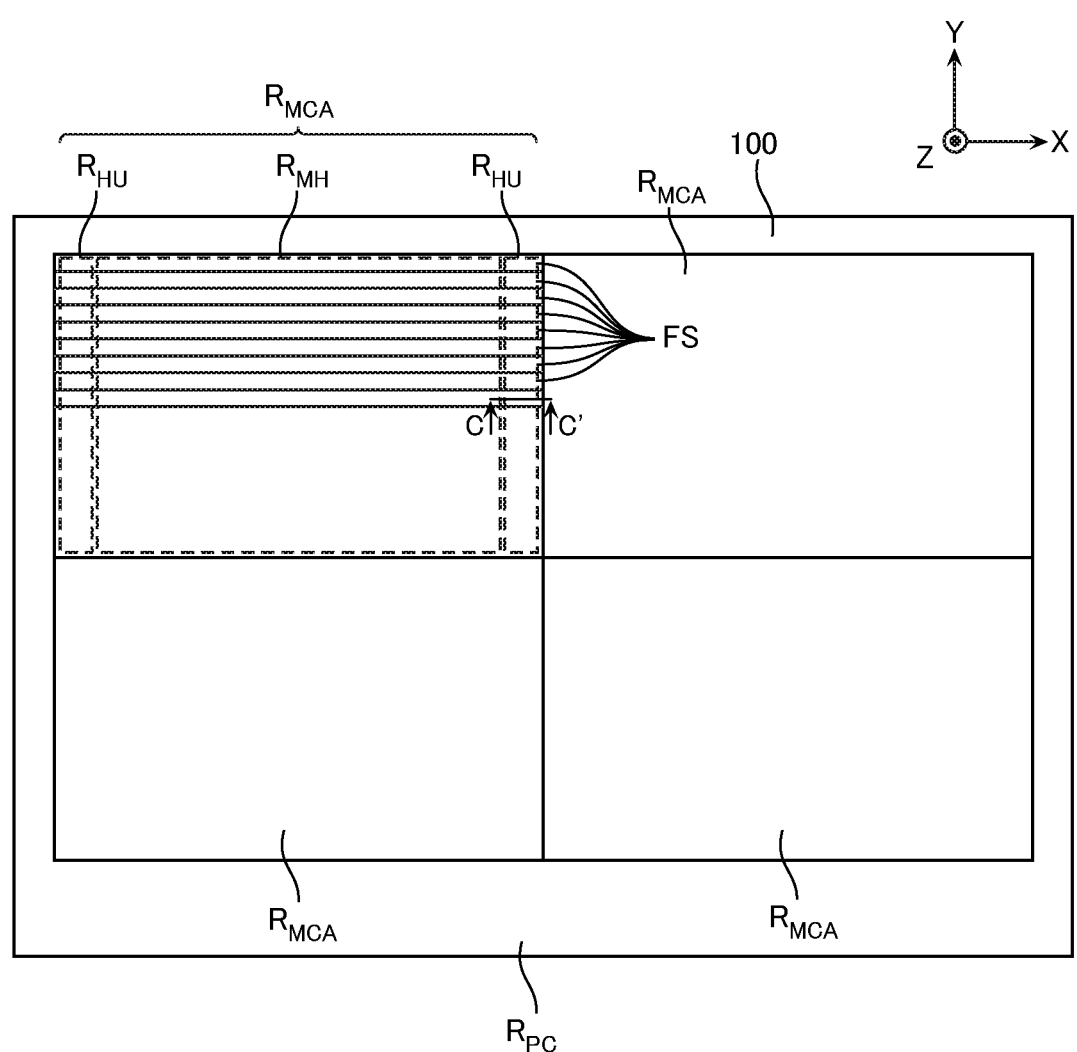
FIG. 1 is a schematic plan view of a semiconductor memory device according to the first embodiment.

A semiconductor memory device according to one embodiment comprises a substrate extending in a first direction and a second direction intersecting with the first direction; a plurality of finger structures arranged in the first direction, including a first region and a second region arranged in the second direction; and an inter-finger insulating member disposed between a first finger structure and a second finger structure adjacent to one another in the first direction among the plurality of finger structures. The first finger structure includes: a plurality of conductive layers stacked in a stacking direction intersecting with a surface of the substrate and extending in the second direction across the first region and the second region; a semiconductor column disposed in the first region, extending in the stacking direction, and opposed to the plurality of conductive layers;

an electric charge accumulating film disposed between the plurality of conductive layers and the semiconductor column; a plurality of via-contact electrodes disposed in the second region, extending in the stacking direction, and connected to a plurality of terrace portions of the plurality of conductive layers; a first insulating layer covering the plurality of terrace portions and surrounding outer peripheral surfaces of the plurality of via-contact electrodes; a second insulating layer covering the plurality of terrace portions via the first insulating layer and surrounding the outer peripheral surfaces of the plurality of via-contact electrodes; and a third insulating layer disposed between the first insulating layer and the inter-finger insulating member in the first direction. The second insulating layer and the third insulating layer have mutually same main components, at least a part of a main component of the first insulating layer is different from the main components of the second insulating layer and the third insulating layer, and the second insulating layer and the third insulating layer have mutually different etching rates.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a direction parallel to a surface of the substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction intersecting with a surface of the substrate is referred to as a stacking direction in some cases. A direction along a predetermined plane intersecting with the stacking direction may be referred to as a first direction, and a direction along the plane and intersecting with the first direction may be referred to as a second direction. The stacking direction may or may not match the Z-direction. The first direction and the second direction may or may not each correspond to any of the X-direction or the Y-direction.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

First Embodiment

[Configuration]

Figure 2:
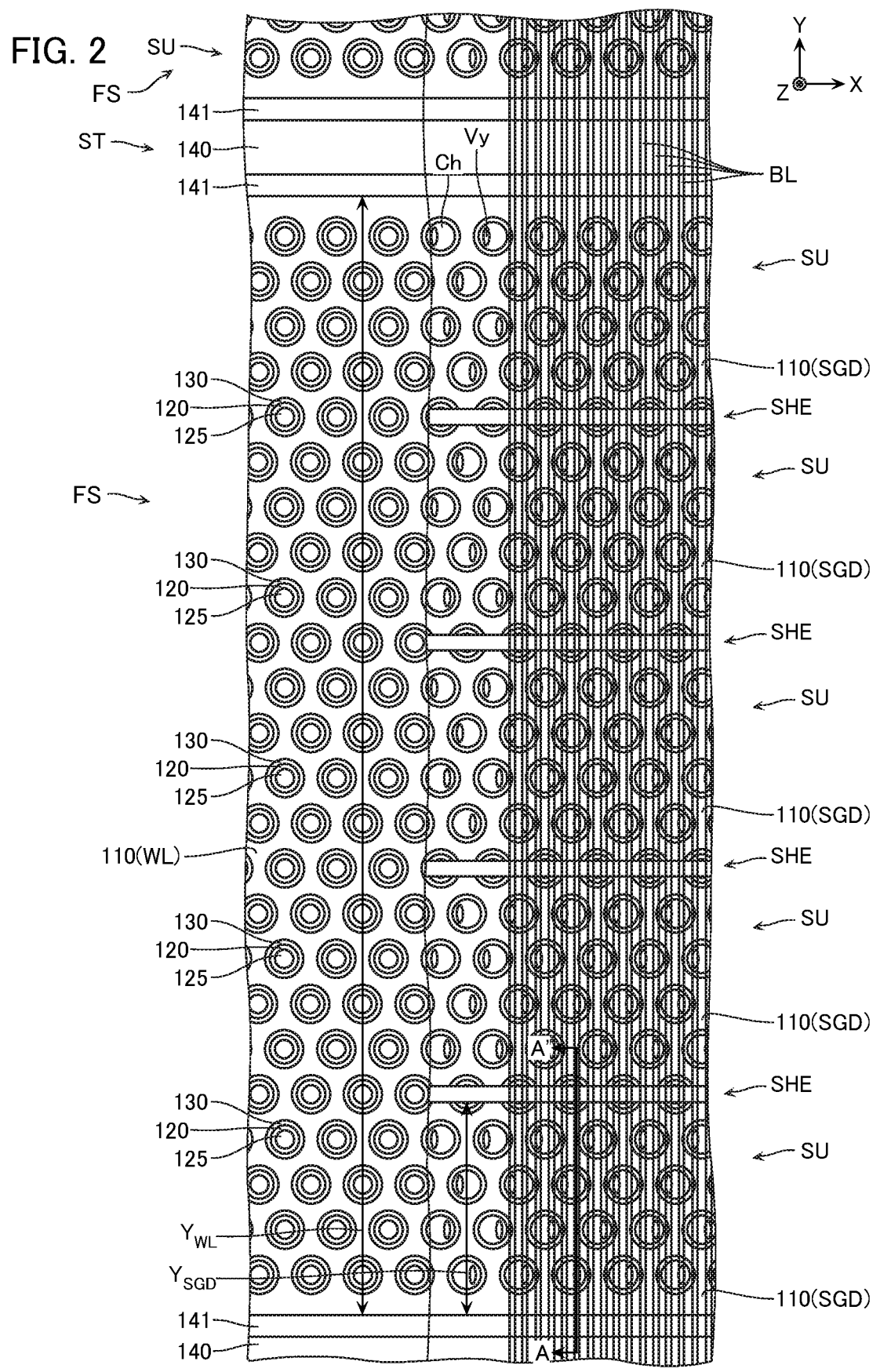
FIG. 2 is a schematic plan view of the same semiconductor memory device.

FIG. 1 is a schematic plan view of a semiconductor memory device according to the first embodiment. FIG. 2 is a schematic plan view of the same semiconductor memory device, and enlarges and illustrates a part of FIG. 1.

As illustrated in FIG. 1, the semiconductor memory device according to the embodiment includes a semiconductor substrate 100. In the illustrated example, the semiconductor substrate 100 includes four memory cell array regions $R_{MCA}$ arranged in the X-direction and Y-direction. A peripheral circuit region $R_{PC}$ is disposed at an end portion in the Y-direction of the semiconductor substrate 100.

The memory cell array region $R_{MCA}$ includes a plurality of finger structures FS arranged in the Y-direction. The finger structure FS includes a memory hole region $R_{MH}$ extending in the X-direction and hook-up regions $R_{HU}$ disposed in regions on an X-direction positive side and an X-direction negative side with respect to the memory hole region $R_{MH}$. The memory hole region $R_{MH}$ includes, for example, as illustrated in FIG. 2, a plurality of string units SU arranged in the Y-direction. Between two finger structures FS adjacent to one another in the Y-direction, an inter-finger structure ST is disposed. Between two string units SU adjacent to one another in the Y-direction, an inter-string unit insulating member SHE of silicon oxide ($SiO_2$) or the like is disposed.

In this embodiment, one finger structure FS functions as one block of a NAND flash memory. However, the plurality of finger structures FS may function as one block. The finger structure FS may include only one string unit SU.

In this embodiment, the hook-up regions $R_{HU}$ are disposed at both ends of the finger structure FS in the X-direction. Such a configuration, however, is merely an example, and the specific configuration is adjustable as appropriate. For example, the hook-up region $R_{HU}$ may be disposed only on one end of the finger structure FS in the X-direction or may be disposed in the center of the finger structure FS in the X-direction.

[Structure of Memory Hole Region $R_{MH}$]

Figure 3:
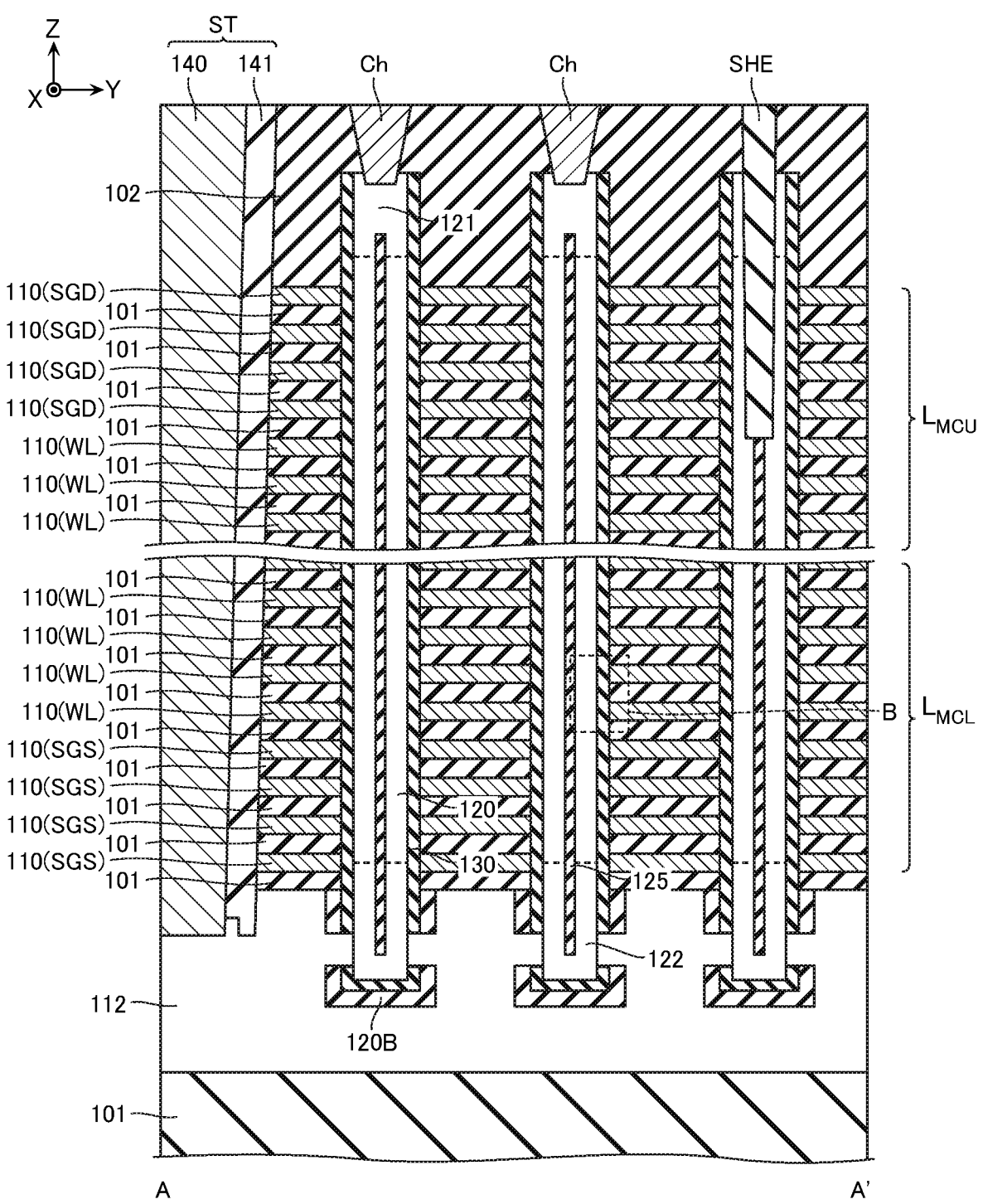
FIG. 3 is a schematic cross-sectional view of the structure illustrated in FIG. 2 taken along a line A-A' viewed in an arrow direction.
Figure 4:
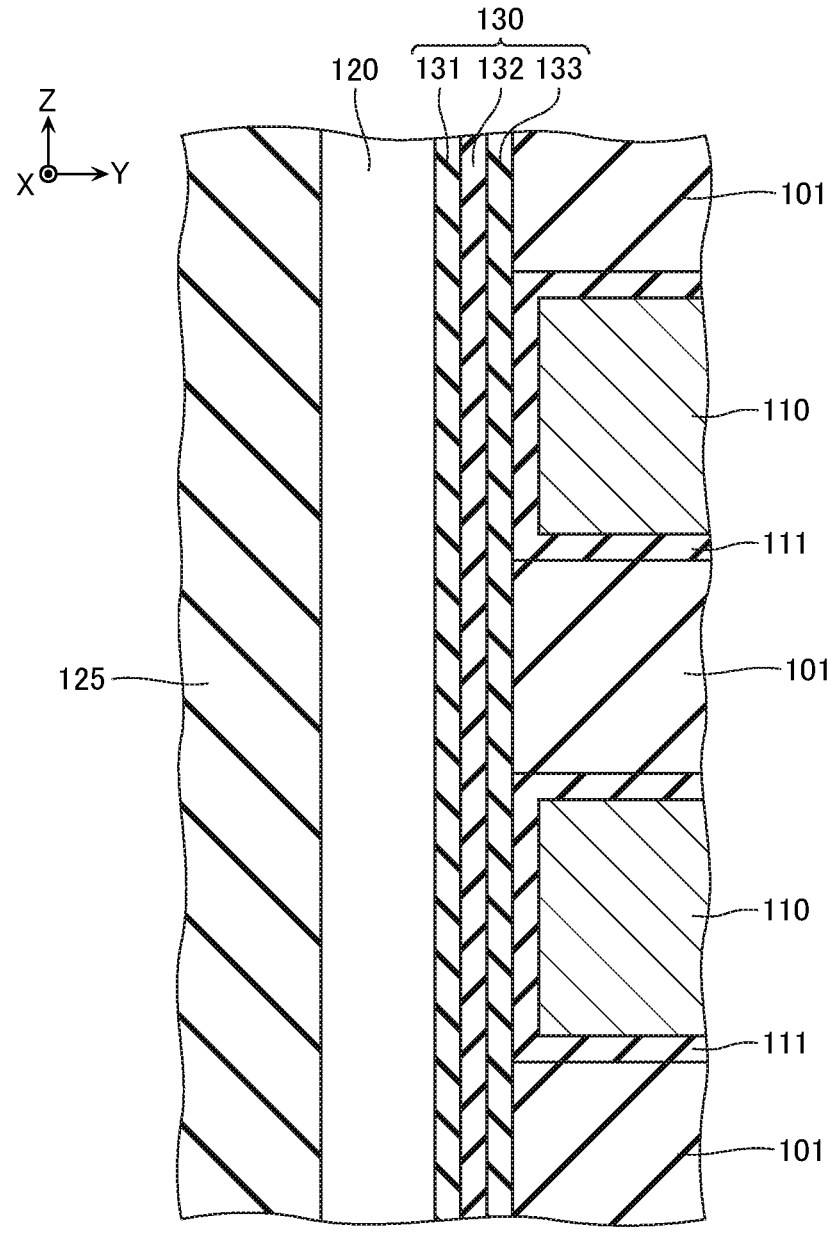
FIG. 4 is a schematic enlarged view of a part indicated by B in FIG. 3.

FIG. 3 is a schematic cross-sectional view of the structure illustrated in FIG. 2 taken along a line A-A' viewed in an arrow direction. FIG. 4 is a schematic enlarged view of the part indicated by B in FIG. 3. Note that while FIG. 4 illustrates a YZ cross-sectional surface, also when cross-sectional surfaces (for example, an XZ cross-sectional surface) other than the YZ cross-sectional surface along a central axis of a semiconductor column 120 is observed, a structure similar to that in FIG. 4 is observed.

The finger structure FS includes, for example, as illustrated in FIG. 3, a memory cell array layer $L_{MCL}$ and a memory cell array layer $L_{MCU}$ disposed above the memory cell array layer $L_{MCL}$. The memory cell array layers $L_{MCL}$, $L_{MCU}$ each include a plurality of conductive layers 110 stacked in the Z-direction. The finger structure FS includes a wiring layer 112 disposed below these plurality of conductive layers 110, the plurality of semiconductor columns 120 extending in the Z-direction, and a gate insulating film 130 disposed between the plurality of conductive layers 110 and the plurality of semiconductor columns 120.

The conductive layer 110 has an approximately plate shape extending in the X-direction. The conductive layer 110 may include, for example, a stacked film of a barrier conductive film of titanium nitride (TiN) or the like and a metal film of tungsten (W) or the like. The conductive layer 110 may contain, for example, polycrystalline silicon containing impurities, such as phosphorus (P) or boron (B). Between the plurality of conductive layers 110 arranged in the Z-direction, insulating layers 101 of silicon oxide (SiO$_2$) or the like are disposed. An insulating layer 102 of silicon oxide (SiO$_2$) or the like is disposed on an upper surface of the conductive layer 110 as the uppermost layer.

The plurality of conductive layers 110 included in the memory cell array layers L$_{MCL}$, L$_{MCU}$ function as word lines WL and gate electrodes of the plurality of memory cells (memory transistors) connected to the word lines WL of the NAND flash memory. In the following description, such conductive layers 110 are referred to as conductive layers 110 (WL) in some cases. These plurality of conductive layers 110 (WL) are each electrically independent for each finger structure FS. When two finger structures FS adjacent to one another in the Y-direction are focused on, the plurality of conductive layers 110 (WL) arranged in the Z-direction and the plurality of insulating layers 101 disposed on upper surfaces and lower surfaces of the plurality of conductive layers 110 (WL) in these two finger structures FS are separated in the Y-direction via the inter-finger structure ST.

In the memory cell array layer L$_{MCL}$, one or a plurality of conductive layers 110 positioned below the plurality of conductive layers 110 (WL) function as a source-side select gate line SGS and gate electrodes of a plurality of select transistors connected to the source-side select gate line SGS of the NAND flash memory. In the following description, such a conductive layer 110 will be referred to as a conductive layer 110 (SGS) in some cases. When two finger structures FS adjacent to one another in the Y-direction are focused on, one or a plurality of conductive layers 110 (SGS) and the plurality of insulating layers 101 disposed on upper surfaces and lower surfaces of the one or plurality of conductive layers 110 (SGS) in these two finger structures FS are separated in the Y-direction via the inter-finger structure ST.

In the memory cell array layer L$_{MCU}$, one or a plurality of conductive layers 110 positioned above the plurality of conductive layers 110 (WL) each function as a drain-side select gate line SGD and gate electrodes of a plurality of select transistors connected to the drain-side select gate line SGD of the NAND flash memory. In the following description, such a conductive layer 110 is referred to as a conductive layer 110 (SGD) in some cases.

As illustrated in FIG. 2, a width Y$_{SGD}$ in the Y-direction of these plurality of conductive layers 110 (SGD) is smaller than a width Y$_{WL}$ in the Y-direction of the conductive layer 110 (WL).

The plurality of conductive layers 110 (SGD) are each electrically independent for each string unit SU. In each finger structure FS, when two string units SU adjacent to one another in the Y-direction are focused on, one or a plurality of conductive layers 110 (SGD) in these two string units SU are separated in the Y-direction via the inter-string unit insulating member SHE. When, among the plurality of string units SU included in one of two finger structures FS adjacent to one another in the Y-direction, one that is the closest to the other, and among the plurality of string units SU included in the other, one that is the closest to the one are focused on, one or a plurality of conductive layers 110

(SGD) in these two string units SU are separated in the Y-direction via the inter-finger structure ST.

As illustrated in FIG. 4, on an upper surface, a lower surface, and an opposed surface to the semiconductor column 120 of the conductive layer 110, a high-dielectric-constant insulating film 111 is disposed. The high-dielectric-constant insulating film 111 contains, for example, a metal oxide, such as alumina (Al$_2$O$_3$). The high-dielectric-constant insulating film 111 has a dielectric constant larger than that of, for example, silicon oxide (SiO$_2$). The high-dielectric-constant insulating film 111 has a dielectric constant larger than that of, for example, silicon nitride (SiN).

The wiring layer 112 (FIG. 3) may, for example, contain polycrystalline silicon or the like containing N-type impurities, such as phosphorus (P). On a lower surface of the wiring layer 112, a conductive member of a metal, such as tungsten (W), tungsten silicide, or the like, or another conductive member may be disposed. The wiring layer 112 functions as a part of a source line of the NAND flash memory. Note that, in the example in FIG. 3, an insulating layer 120B of silicon oxide (SiO$_2$) or the like is disposed between the wiring layer 112 and the gate insulating film 130.

The semiconductor columns 120 are, as illustrated in FIG. 2, arranged in the predetermined pattern in the X-direction and the Y-direction. The semiconductor column 120 functions as channel regions of memory cells (memory transistors) and select transistors of the NAND flash memory. The semiconductor column 120 has an approximately cylindrical shape and has a center portion provided with an insulating column 125 of silicon oxide or the like. The semiconductor column 120 has outer peripheral surfaces surrounded by through-holes formed in the conductive layers 110 (WL), 110 (SGS), and 110 (SGD) and opposed to inner peripheral surfaces of such through-holes.

The semiconductor column 120 contains, for example, polycrystalline silicon (Si). A region of the semiconductor column 120 opposed to the conductive layer 110 (WL) may be non-doped. A region of the semiconductor column 120 opposed to the conductive layer 110 (SGD) may be non-doped or may contain P-type impurities, such as boron (B). At least a part of a region of the semiconductor column 120 opposed to the conductive layer 110 (SGS) may be non-doped. A part of the region of the semiconductor column 120 opposed to the conductive layer 110 (SGS) may contain N-type impurities, such as phosphorus (P).

The semiconductor columns 120 have upper end portions provided with impurity regions 121 containing N-type impurities, such as phosphorus (P), as illustrated in FIG. 3. The impurity region 121 is connected to a bit line BL (FIG. 2) via via-contact electrodes Ch, Vy (FIG. 2). Note that, as illustrated in FIG. 2, the plurality of semiconductor columns 120 corresponding to one string unit SU are all connected to different bit lines BL. In the example in FIG. 2, four columns including the plurality of semiconductor columns 120 arranged in the X-direction are arranged in the Y-direction corresponding to one string unit SU. The plurality of semiconductor columns 120 included in these four columns are all connected to the different bit lines BL.

As illustrated in FIG. 3, the semiconductor columns 120 have lower end portions provided with impurity regions 122 containing N-type impurities, such as phosphorus (P). This impurity region 122 is connected to the above-described wiring layer 112. Note that the plurality of semiconductor columns 120 corresponding to one memory cell array region R$_{MCA}$ (FIG. 1) all are connected to the common wiring layer 112.

The gate insulating film 130 has an approximately cylindrical shape covering the outer peripheral surfaces of the semiconductor column 120. The gate insulating film 130 includes, for example, as illustrated in FIG. 4, a tunnel insulating film 131, an electric charge accumulating film 132, and a block insulating film 133 stacked between the semiconductor column 120 and the conductive layer 110. The tunnel insulating film 131 and the block insulating film 133 contain, for example, silicon oxide ($SiO_2$). The electric charge accumulating film 132 includes, for example, a film of silicon nitride (SiN) or the like configured to accumulate an electric charge. The tunnel insulating film 131, the electric charge accumulating film 132, and the block insulating film 133 have an approximately cylindrical shape, and, for example, as illustrated in FIG. 3, extend in the Z-direction along the outer peripheral surfaces of the semiconductor column 120 excluding a contact portion between the semiconductor column 120 and the wiring layer 112.

Note that FIG. 4 illustrates an example in which the gate insulating film 130 includes the electric charge accumulating film 132 of silicon nitride or the like. The electric charge accumulating film included in the gate insulating film 130 may, however, be a floating gate of polycrystalline silicon or the like containing, for example, N-type or P-type impurities.

The inter-string unit insulating members SHE extend in the X-direction and the Z-direction as illustrated in FIG. 2 and FIG. 3. The inter-string unit insulating member SHE includes, for example, silicon oxide ($SiO_2$). The inter-string unit insulating member SHE has a lower end positioned below a lower surface of the conductive layer 110 (SGD) positioned at the lowermost layer. The inter-string unit insulating member SHE has an upper end whose position in the Z-direction is positioned above an upper surface of the conductive layer 110 (SGD) positioned at the uppermost layer.

The inter-finger structure ST includes, for example, as illustrated in FIG. 2 and FIG. 3, an electrode 140 extending in the X-direction and the Z-direction and insulating members 141 (inter-finger insulating members) of silicon oxide ($SiO_2$) or the like disposed on both side surfaces in the Y-direction of the electrode 140. The electrode 140 is spaced in the Y-direction from the plurality of conductive layers 110 arranged in the Z-direction, the plurality of insulating layers 101 disposed therebetween, and the insulating layer 102 via the insulating member 141. The electrode 140 and the insulating member 141 have lower ends connected to the wiring layer 112. The electrode 140 may be a conductive member including a stacked film or the like of a barrier conductive film of titanium nitride (TiN) or the like and a metal film of tungsten (W) or the like. The electrode 140 may be a semiconductor member of polycrystalline silicon or the like containing impurities, such as phosphorus (P) or boron (B). The electrode 140 may include both the conductive member and the semiconductor member. The electrode 140 functions as a part of the source line of the NAND flash memory.

The via-contact electrodes Ch are arranged in a predetermined pattern in the X-direction and the Y-direction corresponding to the semiconductor columns 120, for example, as illustrated in FIG. 2. The via-contact electrode Ch extends in the Z-direction and has a lower end connected to the impurity region 121 of the semiconductor column 120 and an upper end connected to the via-contact electrode Vy (FIG. 2).

The bit lines BL extend in the Y-direction and are arranged in the X-direction as illustrated in FIG. 2. The bit lines BL have X-direction pitches that are a quarter of X-direction pitches of the plurality of semiconductor columns 120 arranged in the X-direction. The bit line BL may include, for example, a stacked film or the like of a barrier conductive film of titanium nitride (TiN) or the like and a metal film of copper (Cu) or the like. The via-contact electrodes Vy described above are disposed at positions where the bit lines BL and the via-contact electrodes Ch overlap viewing from the Z-direction.

[Structure of Hook-Up Region $R_{Hu}$]

Figure 5:
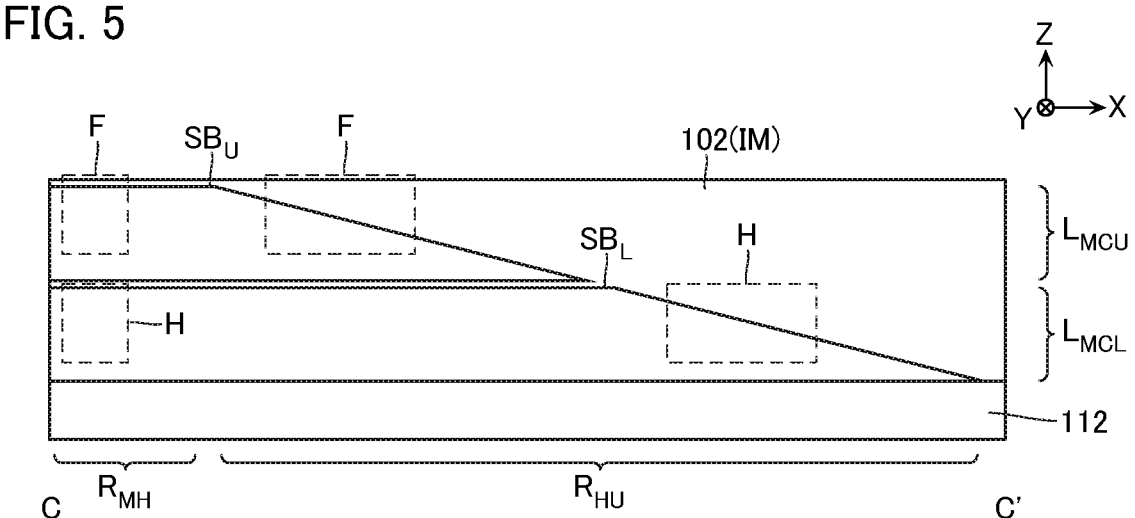
FIG. 5 is a schematic cross-sectional view of the structure illustrated in FIG. 1 taken along a line C-C' viewed in an arrow direction.

FIG. 5 is a schematic cross-sectional view of the structure illustrated in FIG. 1 taken along a line C-C' viewed in an arrow direction.

FIG. 5 exemplarily illustrates stacked bodies $SB_L$, $SB_U$. The stacked body $SB_L$ includes those included in the memory cell array layer $L_{MCL}$ among the plurality of conductive layers 110 and insulating layers 101 described with reference to FIG. 3. The stacked body $SB_U$ includes those included in the memory cell array layer $L_{MCU}$ among the plurality of conductive layers 110 and insulating layers 101 described with reference to FIG. 3. As illustrated in FIG. 5, the hook-up region $R_{HU}$ includes end portions of the stacked bodies $SB_L$, $SB_U$ in the X-direction, that is, end portions of the plurality of conductive layers 110 and insulating layers 101. The end portions of the stacked bodies $SB_L$, $SB_U$ in the X-direction are covered with the insulating layer 102.

Figure 6:
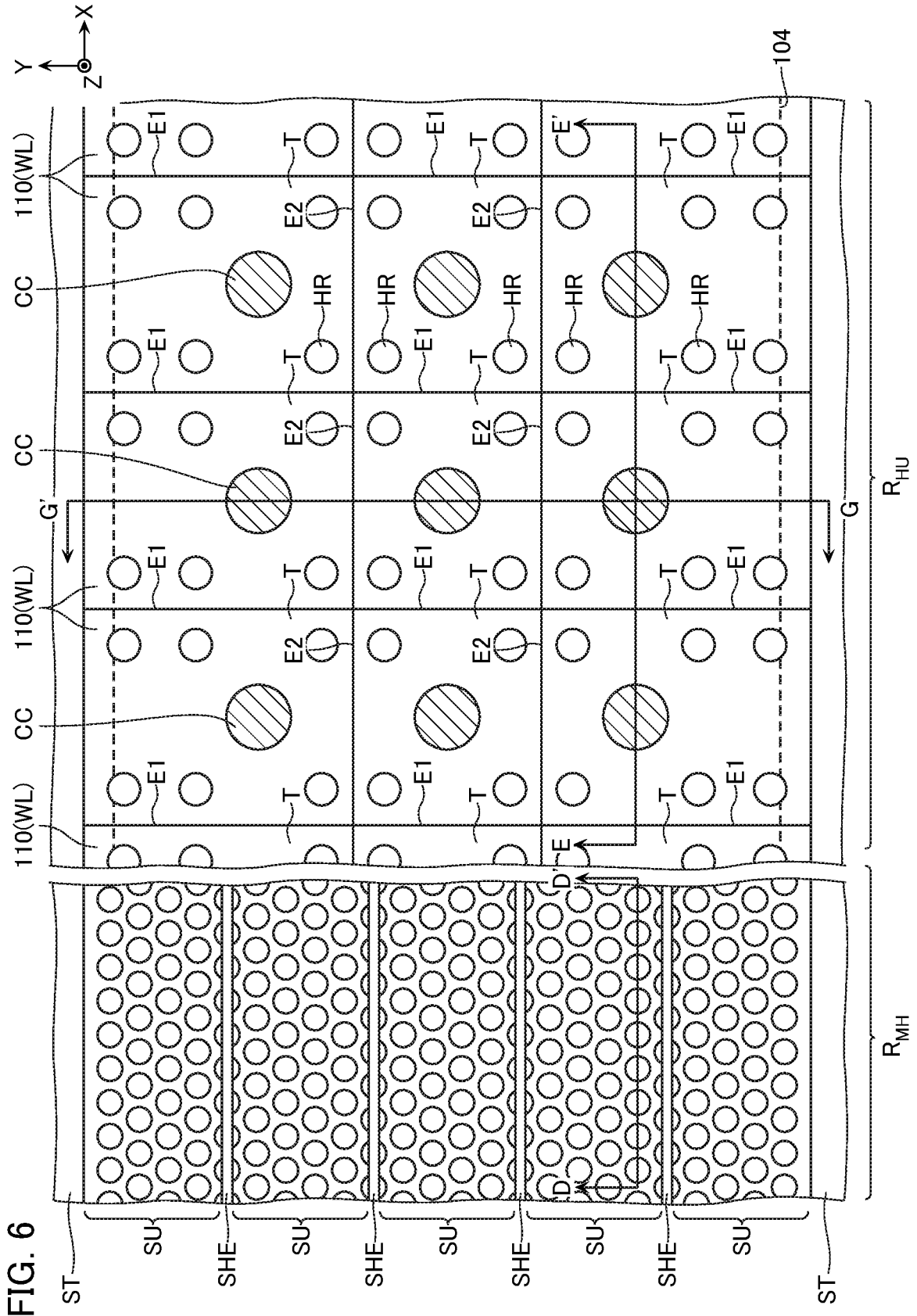
FIG. 6 is a schematic plan view of a semiconductor memory device according to the same embodiment.
Figure 7:
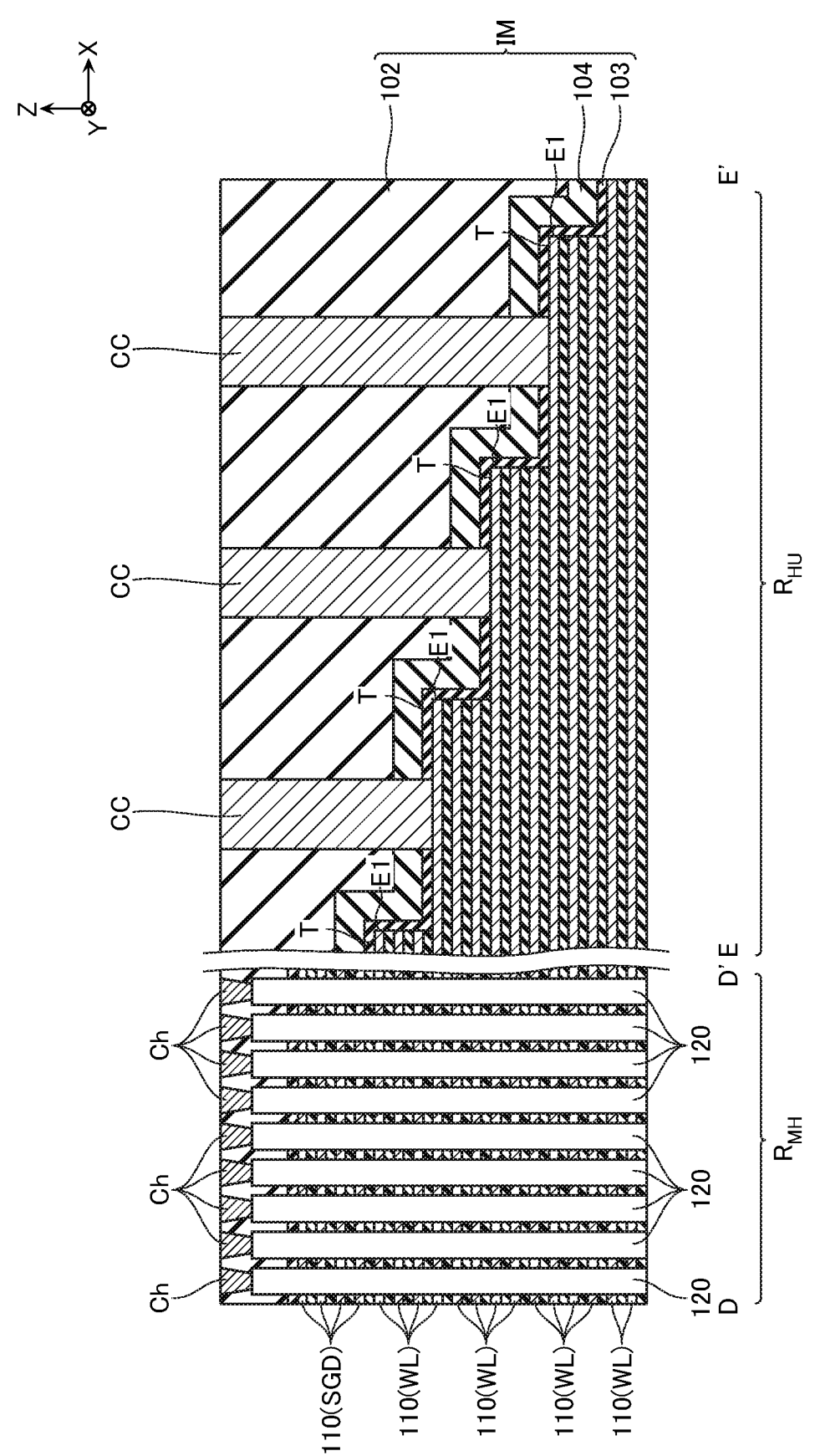
FIG. 7 is a schematic cross-sectional view of the structure illustrated in FIG. 6 taken along lines D-D' and E-E' viewed in an arrow direction.
Figure 8:
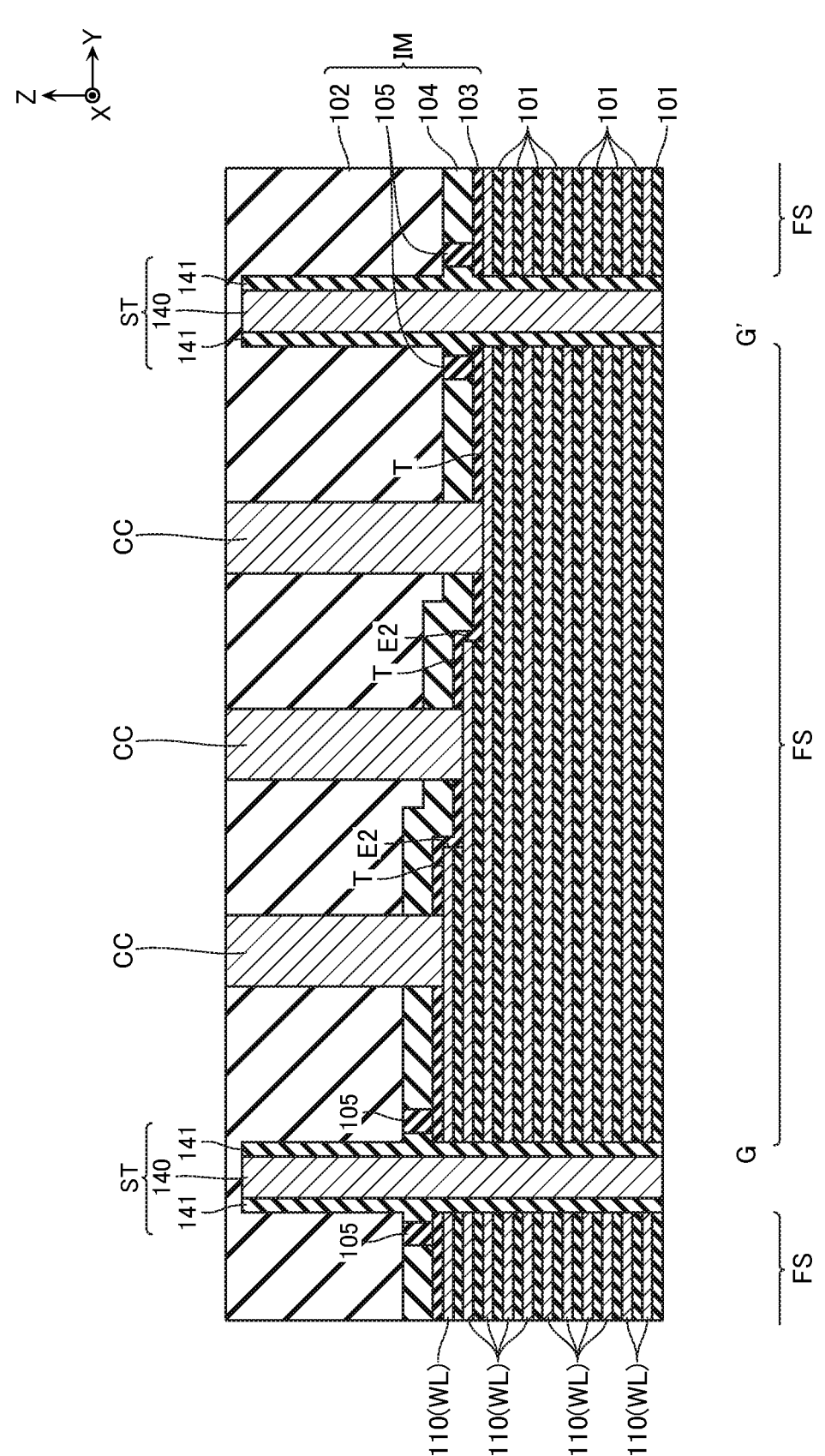
FIG. 8 is a schematic view including a cross-sectional surface of the structure illustrated in FIG. 6 taken along a line G-G' viewed in an arrow direction.

FIG. 6 is a schematic plan view of a semiconductor memory device according to the embodiment and enlarges and illustrates a part of FIG. 1. Note that FIG. 6 omits a part of configuration, such as the insulating layer 102. FIG. 7 is a schematic cross-sectional view of the structure illustrated in FIG. 6 taken along lines D-D' and E-E' viewed in arrow direction. Note that FIG. 7 also corresponds to two portions indicated by F in FIG. 5. FIG. 8 is a schematic view including a cross-sectional surface of the structure illustrated in FIG. 6 taken along a line G-G' viewed in an arrow direction.

The hook-up region $R_{HU}$ is provided with terrace portions T of the plurality of conductive layers 110 as illustrated in FIG. 6 to FIG. 8. For example, the terrace portions T are portions of the upper surfaces of the conductive layers 110 not overlapping with the other conductive layers 110 viewed from above.

In the illustrated example, a plurality of terrace portions T corresponding to $3n+1$-th (n is an integer of 0 or more) conductive layers 110 (WL) counted from above are arranged in X-direction viewing from above. Between the terrace portions T of the $3n+1$-th conductive layers 110 (WL) and the terrace portions T of $3n+4$-th conductive layers 110 (WL), parts of outer edges E1 of the $3n+1$-th to $3n+3$-th conductive layers 110 (WL) are disposed. In the illustrated example, the parts of outer edges E1 are end surfaces in the X-direction of the conductive layers 110 and extend in the Y-direction.

Similarly, in the illustrated example, the plurality of terrace portions T corresponding to $3n+2$-th conductive layers 110 (WL) counted from above are arranged in the X-direction viewing from above. Between the terrace portions T of the $3n+2$-th conductive layers 110 (WL) and the terrace portions T of $3n+5$-th conductive layers 110 (WL), parts of outer edges E1 of the $3n+2$-th to the $3n+4$-th conductive layers 110 (WL) are disposed.

Similarly, in the illustrated example, the plurality of terrace portions T corresponding to the $3n+3$-th conductive layers 110 (WL) counted from above are arranged in the X-direction viewing from above. Between the terrace portions T of the $3n+3$-th conductive layers 110 (WL) and the terrace portion T of $3n+6$-th conductive layers 110 (WL), parts of outer edges E1 of the $3n+3$-th to the $3n+5$-th conductive layers 110 (WL) are disposed.

In the illustrated example, the terrace portions T corresponding to the $3n+1$-th conductive layers 110 (WL) counted from above are each arranged in the Y-direction viewing from above with two terrace portions T corresponding to the $3n+2$-th and the $3n+3$-th conductive layers 110 (WL). Between the terrace portion T of the $3n+1$-th conductive layers 110 (WL) and the terrace portions T of the $3n+2$-th conductive layers 110 (WL), parts of outer edges E2 of the $3n+1$-th conductive layers 110 (WL) are disposed. Similarly, between the terrace portions T of the $3n+2$-th conductive layers 110 (WL) and the terrace portions T of the $3n+3$-th conductive layers 110 (WL), parts of outer edges E2 of the $3n+2$-th conductive layers 110 (WL) are disposed. In the illustrated example, the parts of outer edges E2 are end surfaces in the Y-direction of the conductive layers 110 (WL) and extend in the X-direction.

As illustrated in FIG. 7 and FIG. 8, the hook-up region $R_{HU}$ is provided with an insulator structure IM that covers the plurality of terrace portions T, the above-described parts of outer edges E1, and the above-described parts of outer edges E2 (hereinafter referred to as "terrace portions T and the like").

As illustrated in FIG. 6, each of the terrace portions T is provided with a via-contact electrode CC. In the example in FIG. 6, the plurality of via-contact electrodes CC are arranged in the X-direction via the parts of outer edges E1 of the conductive layers 110 viewing from Z-direction. Three via-contact electrodes CC are arranged in the Y-direction via the parts of outer edges E2 of the conductive layers 110 viewing from the Z-direction corresponding to one finger structure FS. The via-contact electrode CC may include a stacked film of a barrier conductive film of titanium nitride (TiN) or the like and a metal film of tungsten (W) or the like. These plurality of via-contact electrodes CC have outer peripheral surfaces that may be provided with an insulating film of silicon oxide (SiO$_2$) or the like. As illustrated in FIG. 7 and FIG. 8, the via-contact electrodes CC extend in the Z-direction passing through the insulator structure IM (the insulating layer 102 and insulating layers 103, 104 described later). The outer peripheral surface of the via-contact electrode CC is surrounded by a through-hole disposed in the insulator structure IM (the insulating layers 102, 103, 104). The via-contact electrode CC has a lower end connected to the terrace portion T of the conductive layer 110.

As illustrated in FIG. 6, each of the terrace portions T is provided with a plurality of support insulating columns HR arranged in the X-direction and the Y-direction. The support insulating column HR may, for example, contain silicon oxide (SiO$_2$) or the like, or may include a structure similar to those of the semiconductor column 120, the gate insulating film 130, and the insulating column 125. The support insulating column HR extends in the Z-direction passing through the insulator structure IM (the insulating layers 102, 103, 104) and the plurality of conductive layers 110 and insulating layers 101. The support insulating columns HR have outer peripheral surfaces each surrounded by through-holes disposed in the insulator structure IM (the insulating layers 102, 103, 104), the plurality of conductive layers 110 and insulating layers 101. The outer peripheral surface of the support insulating column HR is opposed to an inner peripheral surface of the through-hole of the conductive layer 110 via the high-dielectric-constant insulating film 111 described with reference to FIG. 4. The outer peripheral surface of the support insulating column HR, however, may be in contact with such an inner peripheral surface of the through-hole.

[Structure of Insulator Structure IM]

As illustrated in FIG. 7 and FIG. 8, the insulator structure IM includes the insulating layer 103 that covers the plurality of terrace portions T and the like, the insulating layer 104 disposed on an upper surface of the insulating layer 103, insulating layers 105 (FIG. 8) disposed between the insulating layer 104 and the inter-finger structure ST, and the insulating layer 102 disposed on upper surfaces of the insulating layers 104, 105. The insulating layers 102, 103, 105 include, for example, a material of silicon oxide (SiO$_2$) or the like whose main components are oxygen (O) and silicon (Si). The insulating layer 104 includes, for example, a material of silicon nitride (SiN) or the like whose main components are nitrogen (N) and silicon (Si). The insulating layer 104 covers the plurality of terrace portions T and the like via the insulating layer 103. The insulating layer 102 covers the plurality of terrace portions T and the like via the insulating layers 103, 104.

As illustrated in FIG. 8, the insulating layers 102, 103 cover the upper surfaces of the conductive layers 110 across the entire surfaces. On the other hand, the insulating layer 104 does not cover the upper surfaces of the conductive layers 110 in a constant distance range from the inter-finger structure ST but covers the upper surfaces of the conductive layers 110 in the portions other than that. The insulating layers 104, 105 are disposed at positions overlapping both the insulating layers 102, 103 viewing from the Z-direction.

The insulating layers 102, 103, 105 have mutually the same main components. On the other hand, at least a part of the main component of the insulating layer 104 is different from the main components of the insulating layers 102, 103, 105. As described below, the insulating layers 102, 103, 105 are formed in mutually different processes. In view of this, when silicon oxide or the like is processed in a method, such as wet etching, the insulating layers 102, 103, 105 are removed at mutually different etching rates. Accordingly, for example, when wet etching or the like is executed on the cross-sectional surface illustrated in FIG. 8, etching progresses in the depth direction (X-direction) with respect to the paper surface, and unevenness is formed on the cross-sectional surface corresponding to the degree of the etching progress of the insulating layers 102, 103, 105. The insulating layers 102, 103, 105 are distinguishable by, for example, such a method.

Figure 9:
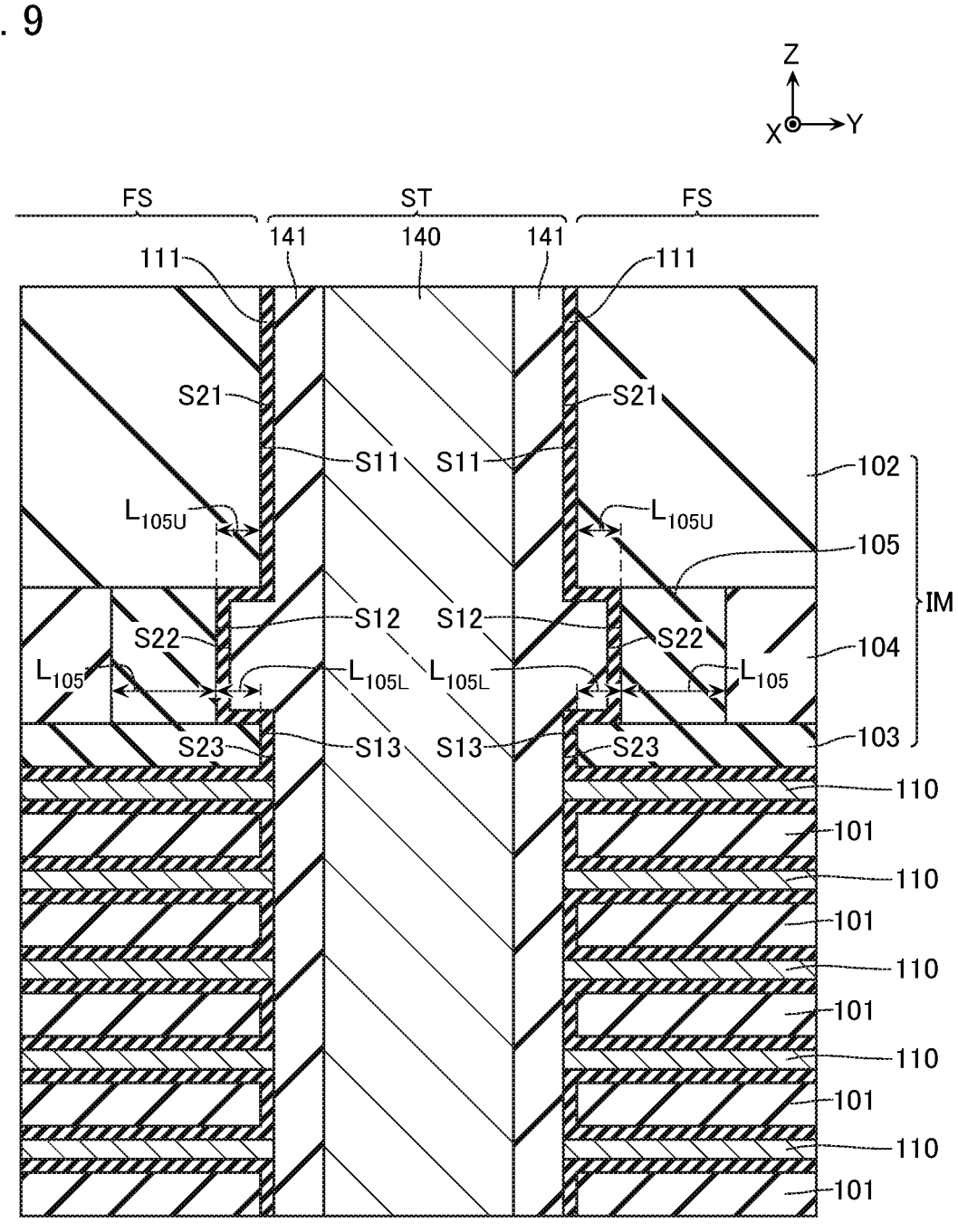
FIG. 9 is a schematic cross-sectional view of a semiconductor memory device according to the same embodiment.

FIG. 9 is a schematic cross-sectional view of the semiconductor memory device according to the embodiment, and enlarges and illustrates a part of FIG. 8.

Between the insulator structure IM and the inter-finger structure ST, as illustrated in FIG. 9, the high-dielectric-constant insulating film 111 described with reference to FIG. 4 may be disposed, or the high-dielectric-constant insulating film 111 is not necessarily disposed.

The insulator structure IM has a surface on an inter-finger structure ST side in the Y-direction (an opposed surface to the inter-finger structure ST via the high-dielectric-constant insulating film 111 or a contact surface with the inter-finger structure ST) including a portion S11, a portion S12 disposed between the portion S11 and the plurality of conductive layers 110, and a portion S13 between the portion S12 and the plurality of conductive layers 110.

The portion S11 is a surface on an inter-finger structure ST side of the insulating layer 102 in the Y-direction. The portion S12 is a surface on an inter-finger structure ST side in the Y-direction of the insulating layer 105. The portion S13 is a surface on an inter-finger structure ST side in the Y-direction of the insulating layer 103. The portions S11, S12, S13 each extend in the Z-direction along a side surface in the Y-direction of the inter-finger structure ST. When two finger structures FS adjacent in the Y-direction are focused on, an upper end of the portion S12 corresponding to one finger structure FS is disposed at a position farther from the other finger structure FS than a lower end in the Y-direction of the portion S11. A lower end of the portion S12 corresponding to the one finger structure FS is disposed at a position farther from the other finger structure FS than an upper end in the Y-direction of the portion S13.

In FIG. 9, a length from the upper end of the portion S12 to the lower end of the portion S11 is indicated by $L_{105U}$. A length from the lower end of the portion S12 to the upper end of the portion S13 is indicated by $L_{105L}$. A length in the Y-direction of the insulating layer 105 is indicated by $L_{105}$. When two finger structures FS adjacent in the Y-direction are focused on, the lengths $L_{105U}$, $L_{105L}$, $L_{105}$ corresponding to one finger structure FS approximately match the lengths $L_{105U}$, $L_{105L}$, $L_{105}$, respectively, corresponding to the other finger structure FS.

The insulating member 141 has a surface on a finger structure FS side in the Y-direction (an opposed surface to the finger structure FS via the high-dielectric-constant insulating film 111 or a contact surface with the finger structure FS) including a portion S21, a portion S22 disposed between the portion S21 and the plurality of conductive layers 110, and a portion S23 disposed between the portion S22 and the plurality of conductive layers 110.

The portion S21 is an opposed surface to the portion S11 in the Y-direction, or a contact surface with the portion S11, of the insulating member 141, and is disposed at a height position corresponding to the portion S11 in the Z-direction. The portion S22 is an opposed surface to the portion S12 in the Y-direction, or the contact surface with the portion S12, of the insulating member 141, and is disposed at a height position corresponding to the portion S12 in the Z-direction. The portion S23 is an opposed surface to the portion S13 in the Y-direction, or a contact surface with the portion S13, of the insulating member 141, and is disposed at a height position corresponding to the portion S13 in the Z-direction. The portions S21, S22, S23 each extend in the Z-direction along the side surface in the Y-direction of the finger structure FS. When two finger structures FS adjacent in the Y-direction are focused on, an upper end of the portion S22 on one finger structure FS side is disposed at a position farther from the other finger structure FS than a lower end of the portion S21. A lower end of the portion S22 on the one finger structure FS side is disposed at a position farther from the other finger structure FS than an upper end of the portion S23.

[Manufacturing Method]

Figure 34:
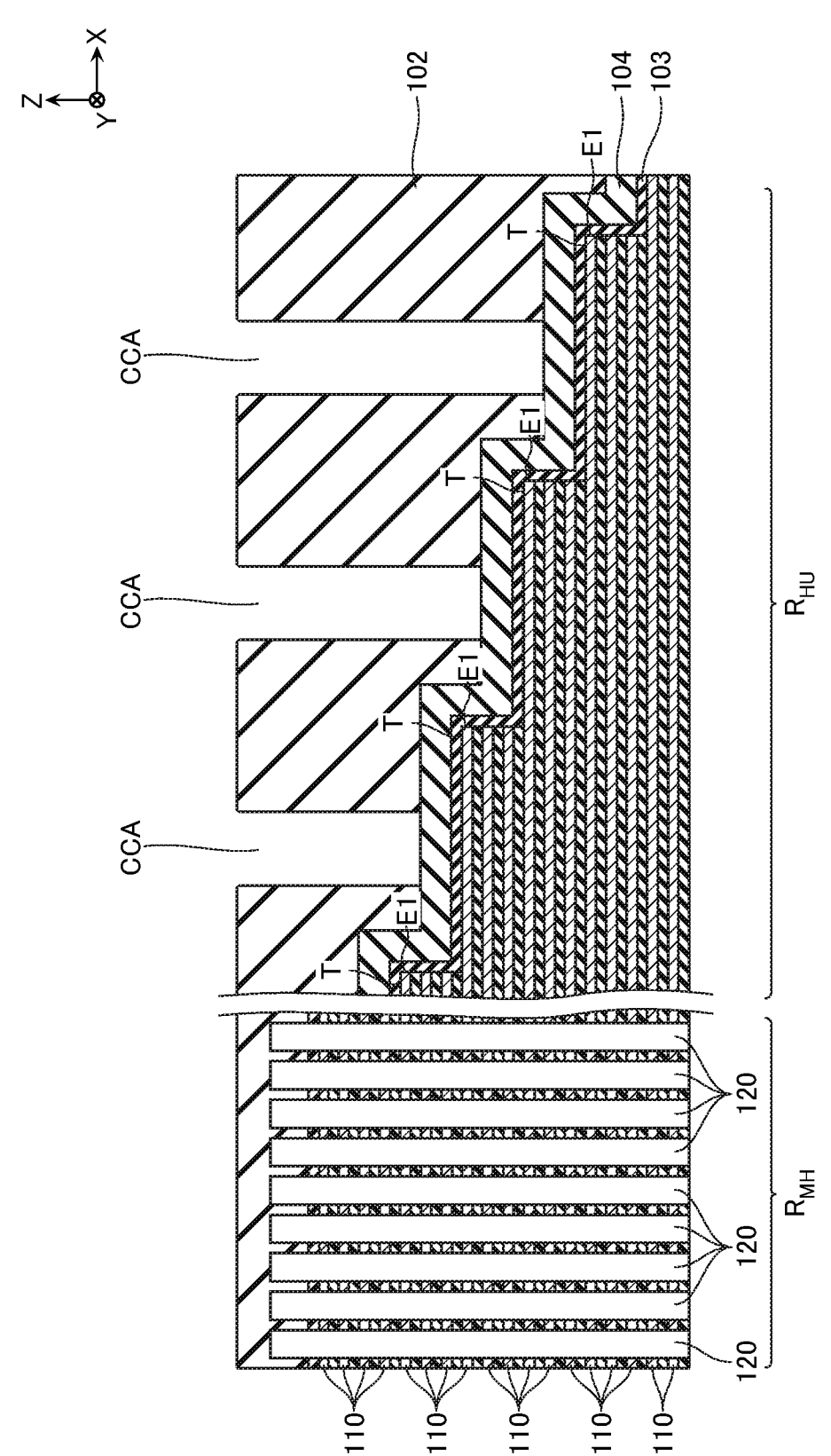
FIG. 34 is a schematic cross-sectional view illustrating the same manufacturing method.
Figure 35:
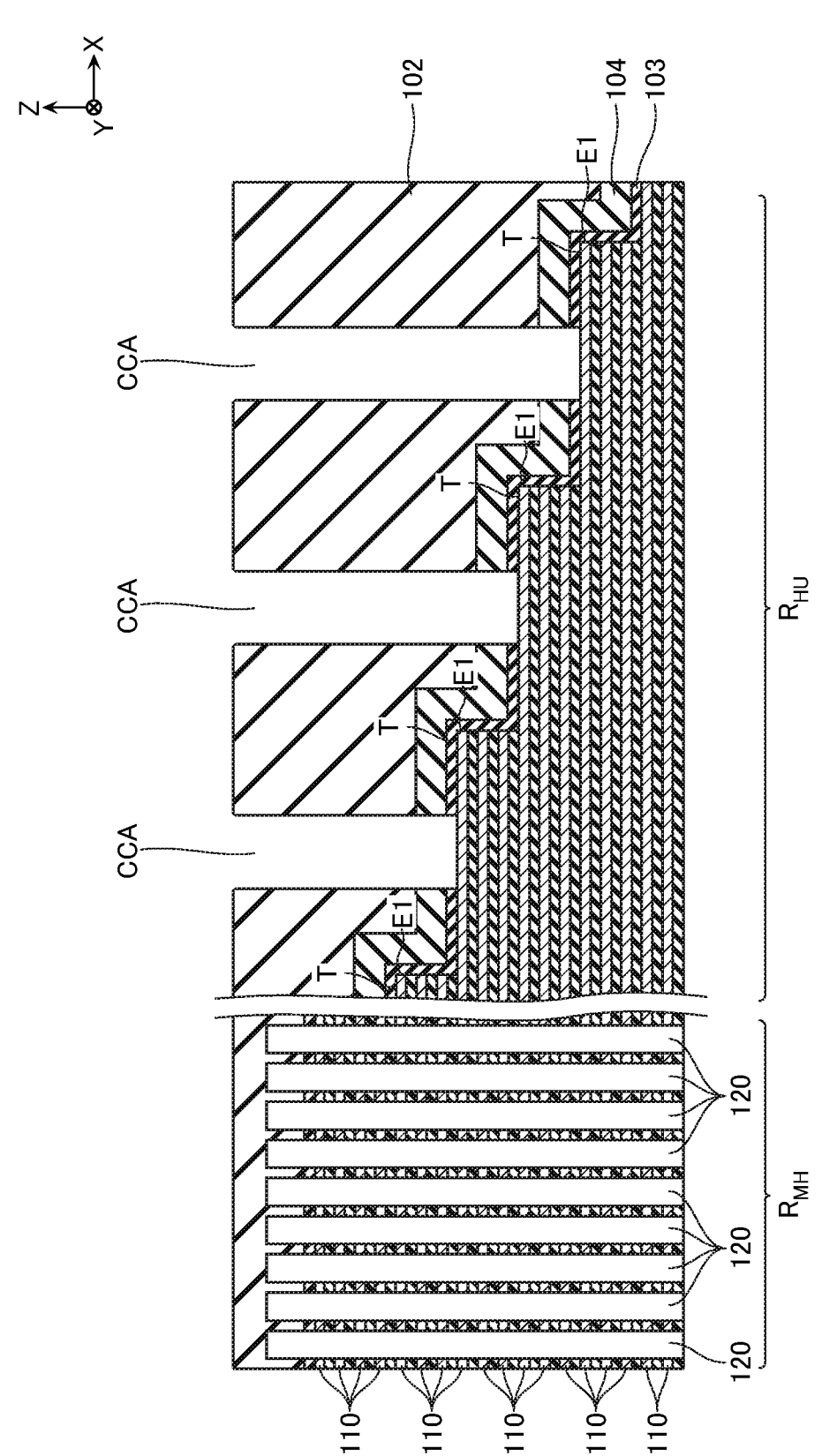
FIG. 35 is a schematic cross-sectional view illustrating the same manufacturing method.
Figure 36:
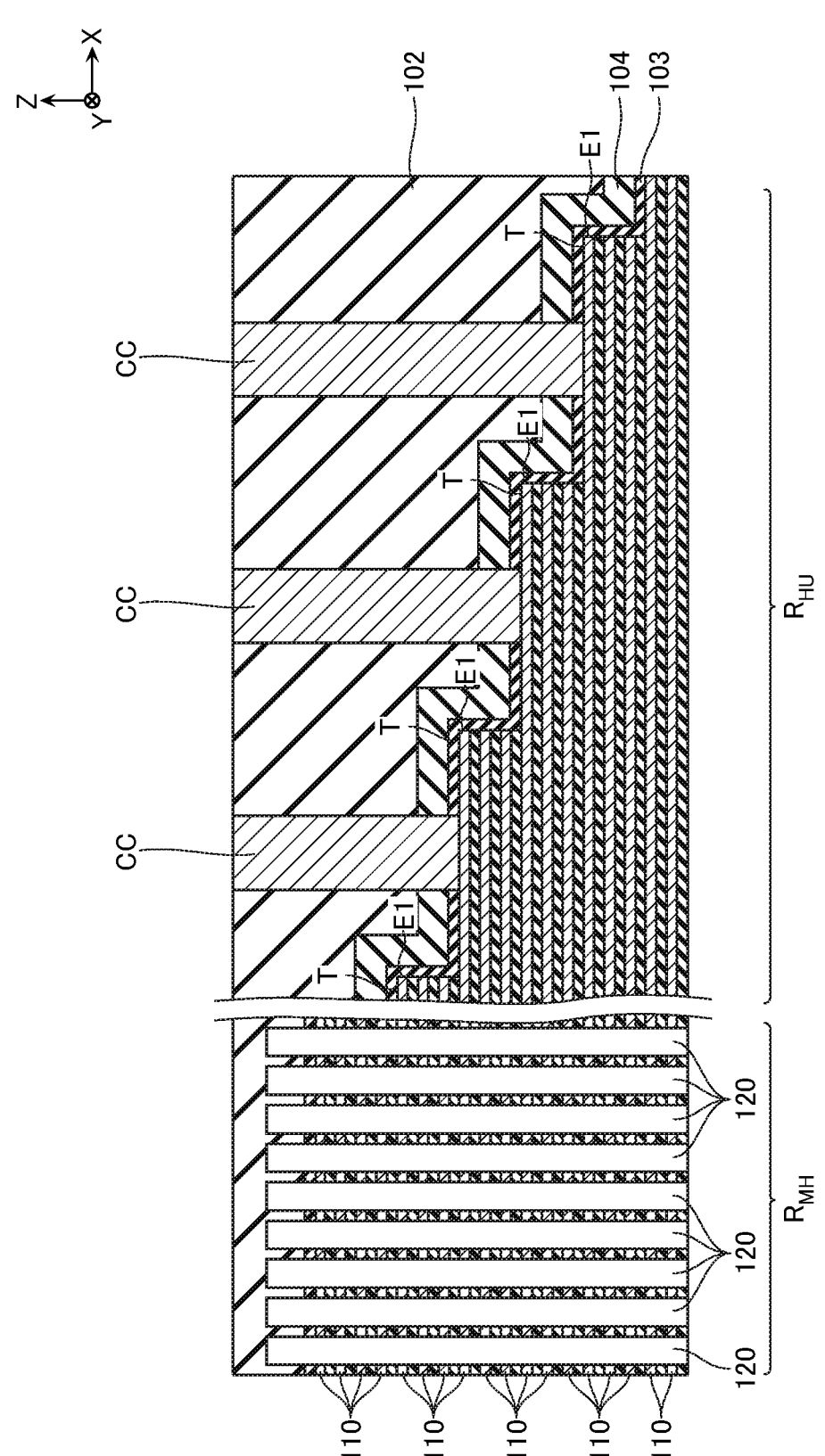
FIG. 36 is a schematic cross-sectional view illustrating the same manufacturing method.

Next, with reference to FIG. 10 to FIG. 36, a method for manufacturing a semiconductor memory device according to a first embodiment will be described. FIG. 10 and FIG. 15 to FIG. 23 are schematic cross-sectional views for describing the same manufacturing method, and illustrate cross-sectional surfaces corresponding to FIG. 3. FIG. 11 to FIG. 14 are schematic cross-sectional views for describing the same manufacturing method, and illustrate cross-sectional surfaces corresponding to two portions indicated by H in FIG. 5. FIG. 24 to FIG. 33 are schematic cross-sectional views for describing the same manufacturing method, and illustrate cross-sectional surfaces corresponding to FIG. 8. FIG. 34 to FIG. 36 are schematic cross-sectional views for describing the same manufacturing method, and illustrate cross-sectional surfaces corresponding to FIG. 7.

Figure 10:
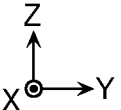
FIG. 10 is a schematic cross-sectional view illustrating a method for manufacturing the semiconductor memory device according to the first embodiment.

In manufacturing the semiconductor memory device according to the embodiment, above a semiconductor wafer (not illustrated), a semiconductor layer 112A of silicon or the like, a sacrifice layer 112B of silicon oxide or the like, a sacrifice layer 112C of silicon nitride (SiN) or the like, a sacrifice layer 112D of silicon oxide or the like, and a semiconductor layer 112E of silicon or the like are formed, for example, as illustrated in FIG. 10. As illustrated in FIG. 10 and FIG. 11, the plurality of insulating layers 101 and a plurality of sacrifice layers 110A corresponding to the plurality of conductive layers 110 in the memory cell array layer $L_{MCL}$ are alternately formed. The sacrifice layer 110A contains, for example, silicon nitride (SiN). This process is, for example, performed by a method, such as CVD (Chemical Vapor Deposition).

Figure 12:
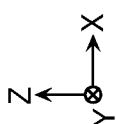
FIG. 12 is a schematic cross-sectional view illustrating the same manufacturing method.
Figure 12:
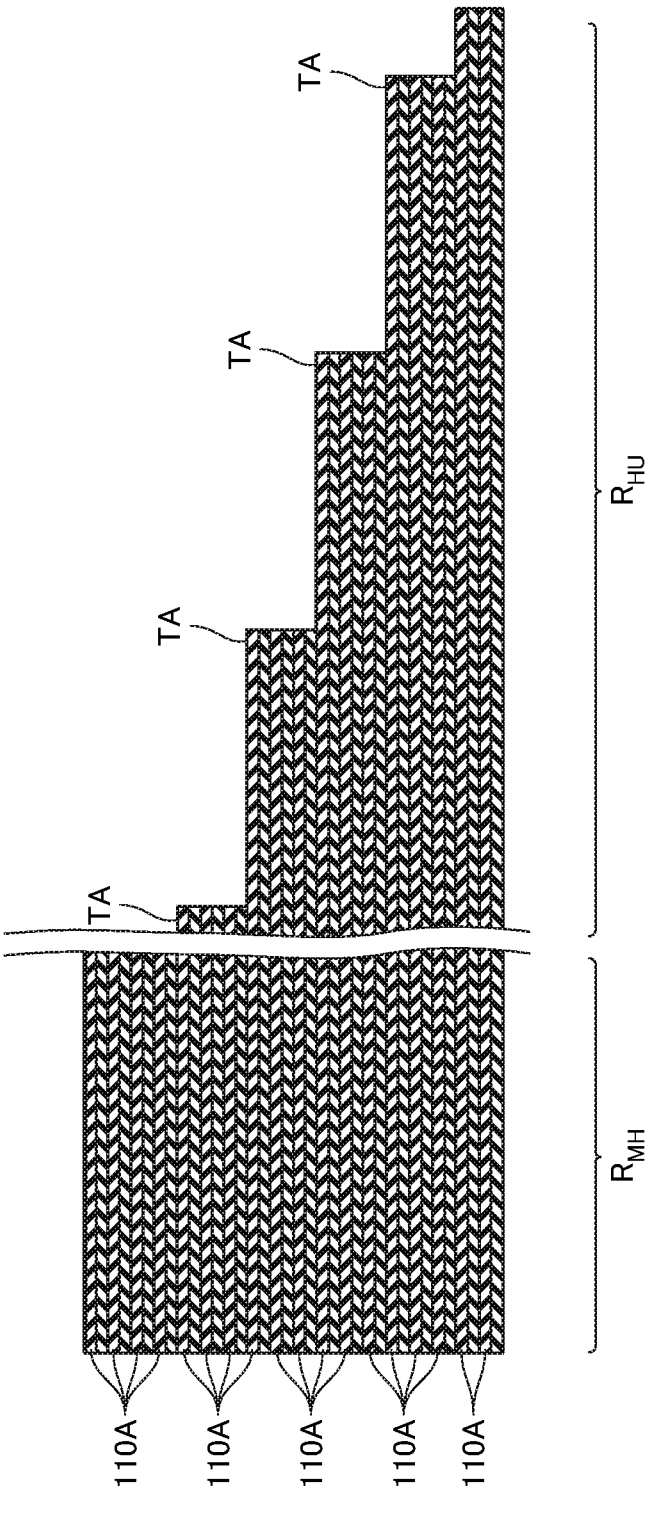

Next, for example, as illustrated in FIG. 12, parts of the plurality of insulating layers 101 and the plurality of sacrifice layers 110A are removed in the hook-up region $R_{HU}$ to form a plurality of terrace portions TA. The terrace portion TA is, for example, a portion of an upper surface of the sacrifice layer 110A that does not overlap other sacrifice layers 110A viewing from above. In this process, for example, a resist is formed on the upper surface of the structure as illustrated in FIG. 11. The removal of the sacrifice layers 110A, the removal of the insulating layers 101, and the removal of a part of the resist are repeated. Note that the removal of the resist is performed by isotropic etching, such as wet etching.

Figure 13:
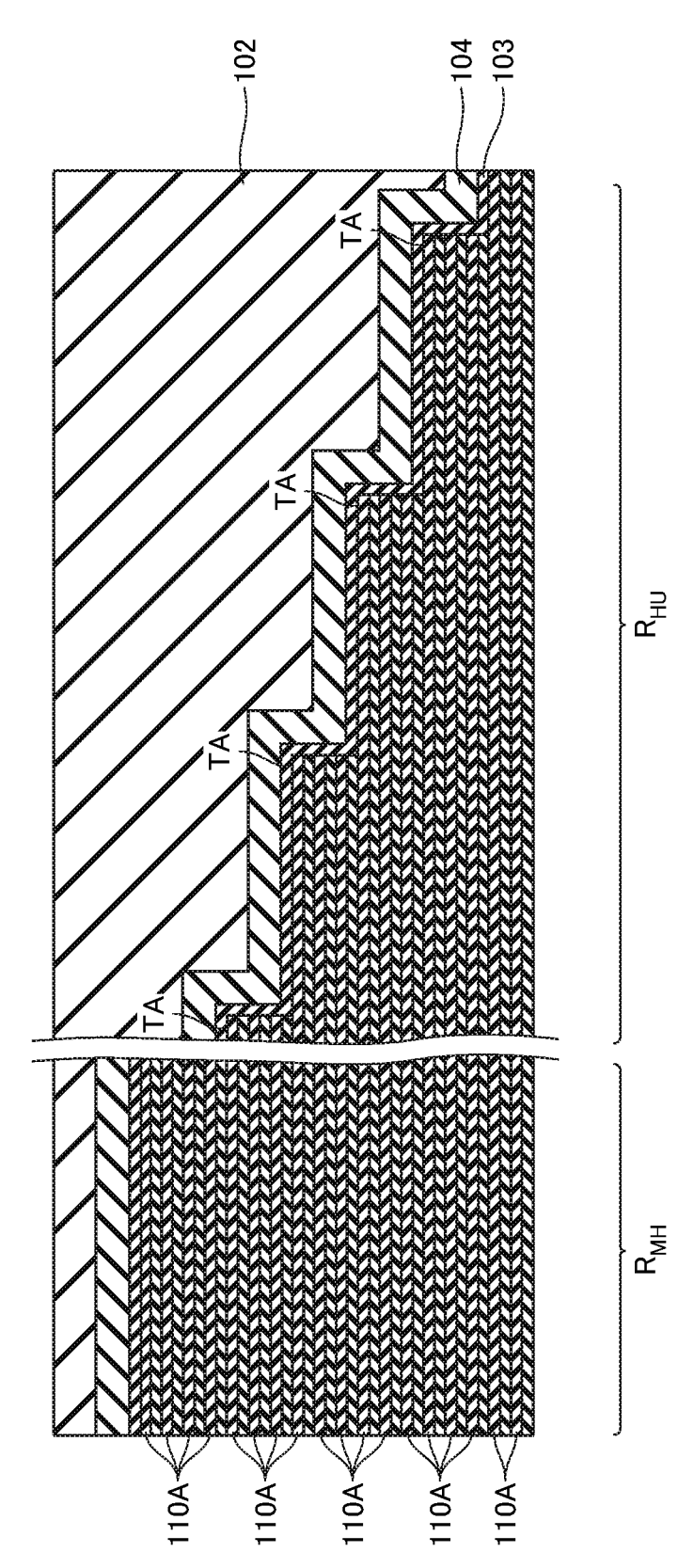
FIG. 13 is a schematic cross-sectional view illustrating the same manufacturing method.

Next, for example, as illustrated in FIG. 13, the insulating layer 103 of silicon oxide ($SiO_2$) or the like covering the plurality of terrace portions TA, the insulating layer 104 of silicon nitride (SiN) or the like, and the insulating layer 102 of silicon oxide ($SiO_2$) or the like are formed. This process is, for example, performed by a method, such as CVD.

Figure 14:
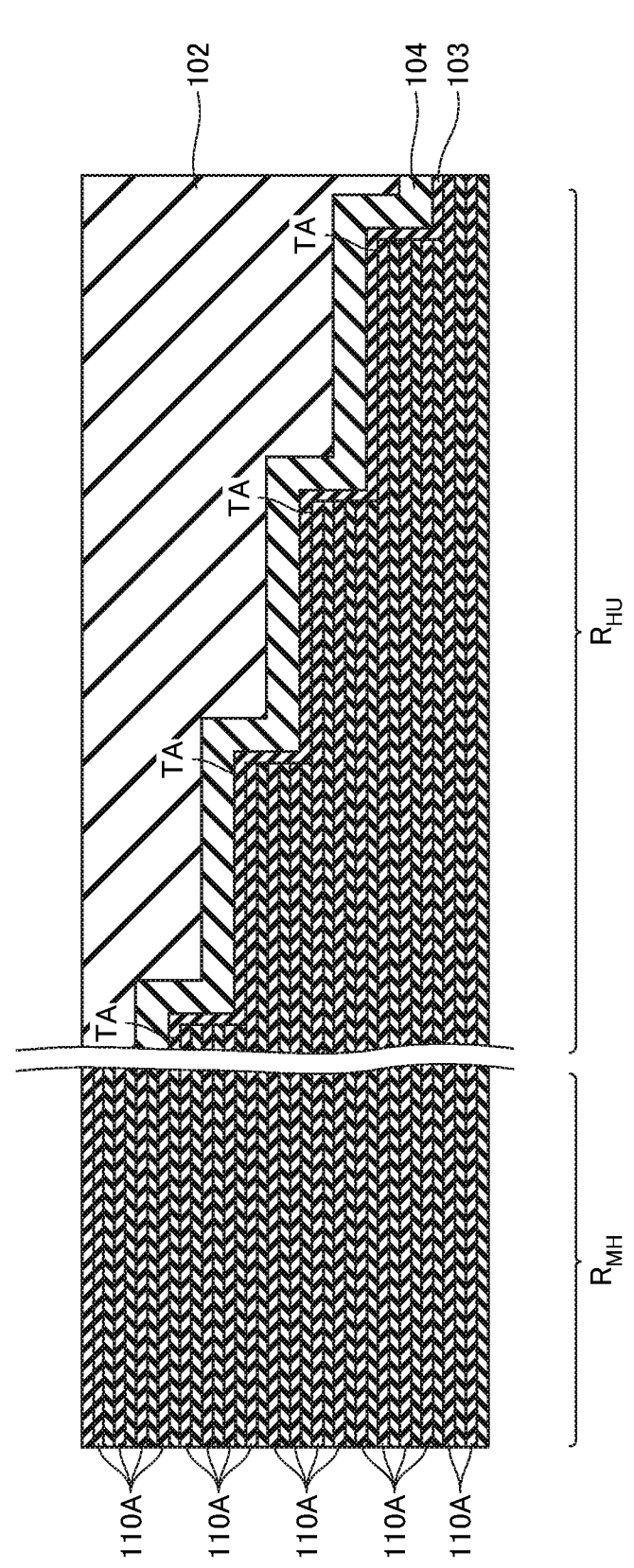
FIG. 14 is a schematic cross-sectional view illustrating the same manufacturing method.

Next, for example, as illustrated in FIG. 14, a flattening process is performed on the structure illustrated in FIG. 13 to remove the portions of the insulating layers 102, 104 formed in the memory hole region $R_{MH}$. This process is, for example, performed by a method, such as etchback using RIE or the like or CMP (Chemical Mechanical Polishing).

Figure 15:
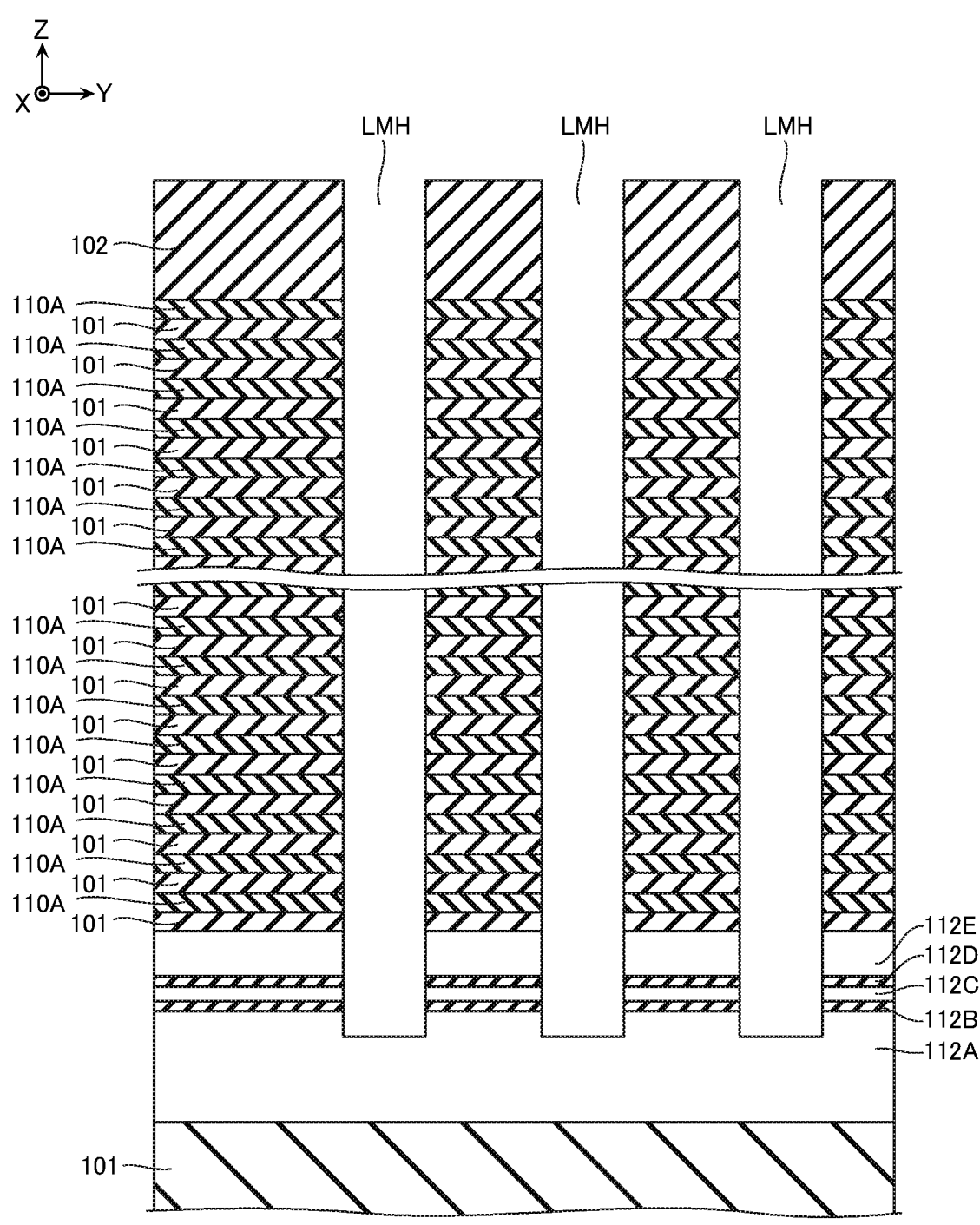
FIG. 15 is a schematic cross-sectional view illustrating the same manufacturing method.

Next, for example, as illustrated in FIG. 15, the insulating layer 102 is further formed on an upper surface of the structure corresponding to FIG. 14. This process is, for example, performed by a method, such as CVD. A plurality of memory holes LMH are formed at positions corresponding to the plurality of semiconductor columns 120. The memory hole LMH is a through-hole that extends in the Z-direction, passes through the insulating layer 102, the insulating layer 101 and the sacrifice layer 110A, the semiconductor layer 112E, and the sacrifice layers 112D, 112C, 112B, and exposes the upper surface of the semiconductor layer 112A. This process is, for example, performed by a method, such as RIE. Note that while the illustration is omitted, through-holes similar to the memory holes LMH may be provided at positions corresponding to the plurality of support insulating columns HR in this process.

Figure 16:
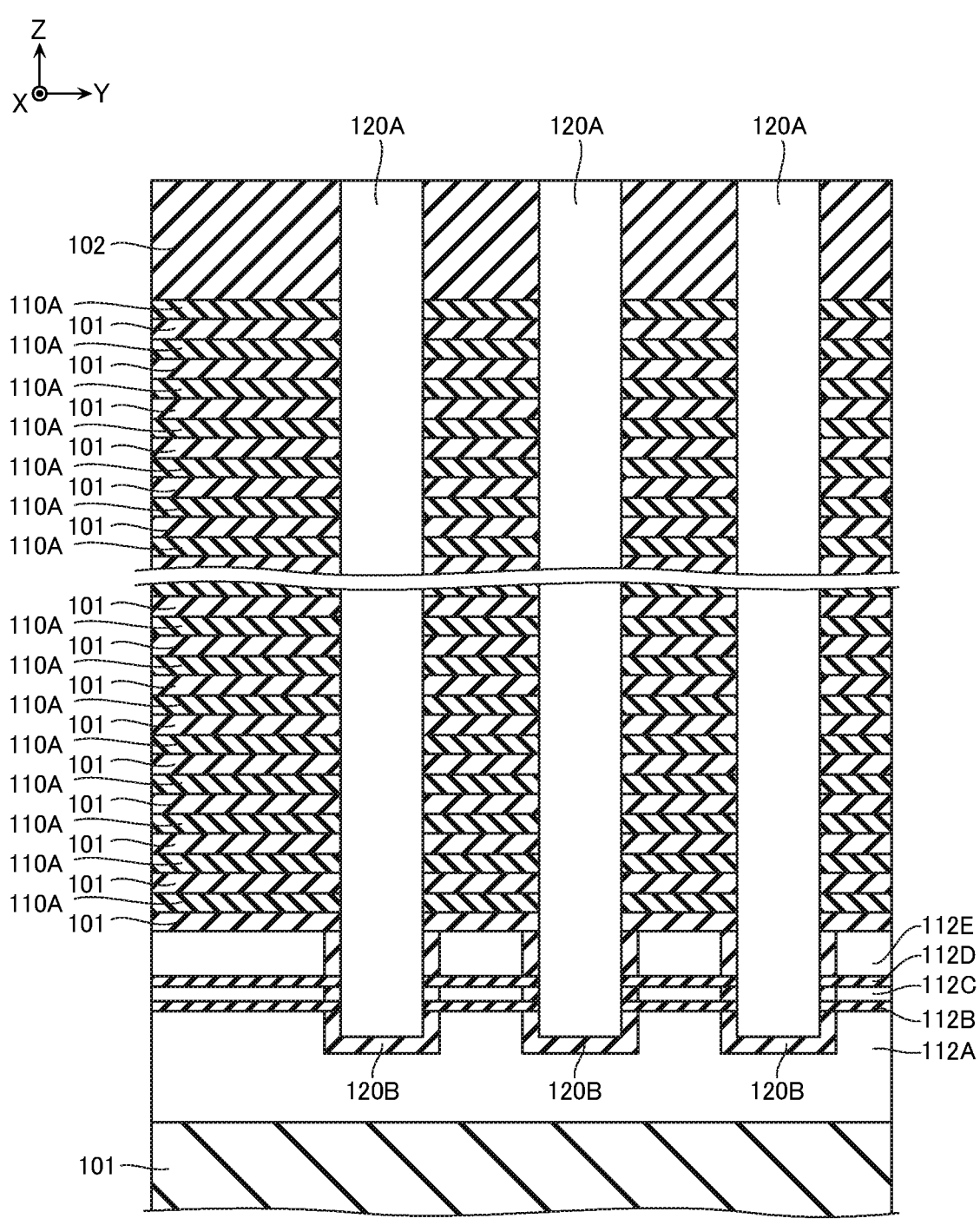
FIG. 16 is a schematic cross-sectional view illustrating the same manufacturing method.

Next, for example, as illustrated in FIG. 16, an oxidation process is performed on the semiconductor layer 112A, the sacrifice layer 112C, and the semiconductor layer 112E via the memory holes LMH to form the insulating layers 120B. This process is, for example, performed in the condition where silicon is oxidized easier than silicon nitride. Sacrifice columns 120A of silicon (Si) or the like are formed inside the memory holes LMH. This process is, for example, performed by a method, such as CVD.

Figure 17:
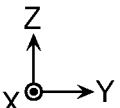
FIG. 17 is a schematic cross-sectional view illustrating the same manufacturing method.

Next, for example, as illustrated in FIG. 17, on an upper surface of the structure corresponding to FIG. 16, the plurality of insulating layers 101 and a plurality of sacrifice layers 110A corresponding to the plurality of conductive layers 110 in the memory cell array layer $L_{MCU}$ are alternately formed. This process is, for example, performed by a method, such as CVD.

Next, the process described with reference to FIG. 12 to the process described with reference to FIG. 14 are executed again.

Figure 18:
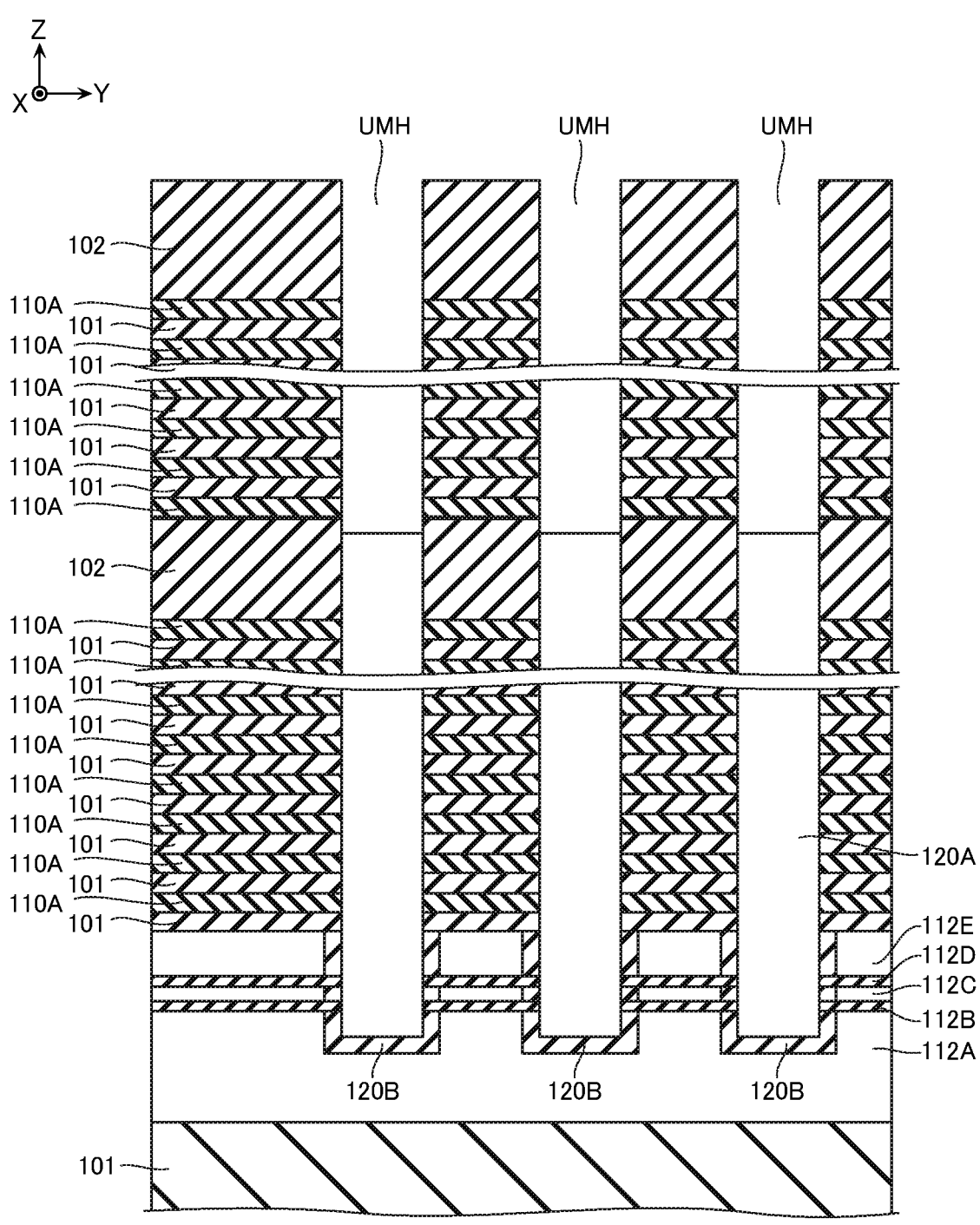
FIG. 18 is a schematic cross-sectional view illustrating the same manufacturing method.

Next, for example, as illustrated in FIG. 18, on an upper surface of the structure after the process corresponding to FIG. 14 is executed again, the insulating layer 102 is further formed. This process is, for example, performed by a method, such as CVD. At the positions corresponding to the plurality of semiconductor columns 120, a plurality of memory holes UMH are formed. The memory hole UMH is a through-hole that extends in the Z-direction, passes through the insulating layer 102, the insulating layers 101 and the sacrifice layers 110A, and exposes the upper surface of the sacrifice column 120A. This process is, for example, performed by a method, such as RIE. Note that while the illustration is omitted, through-holes similar to the memory holes UMH may be provided at positions corresponding to the plurality of support insulating columns HR in this process.

Figure 19:
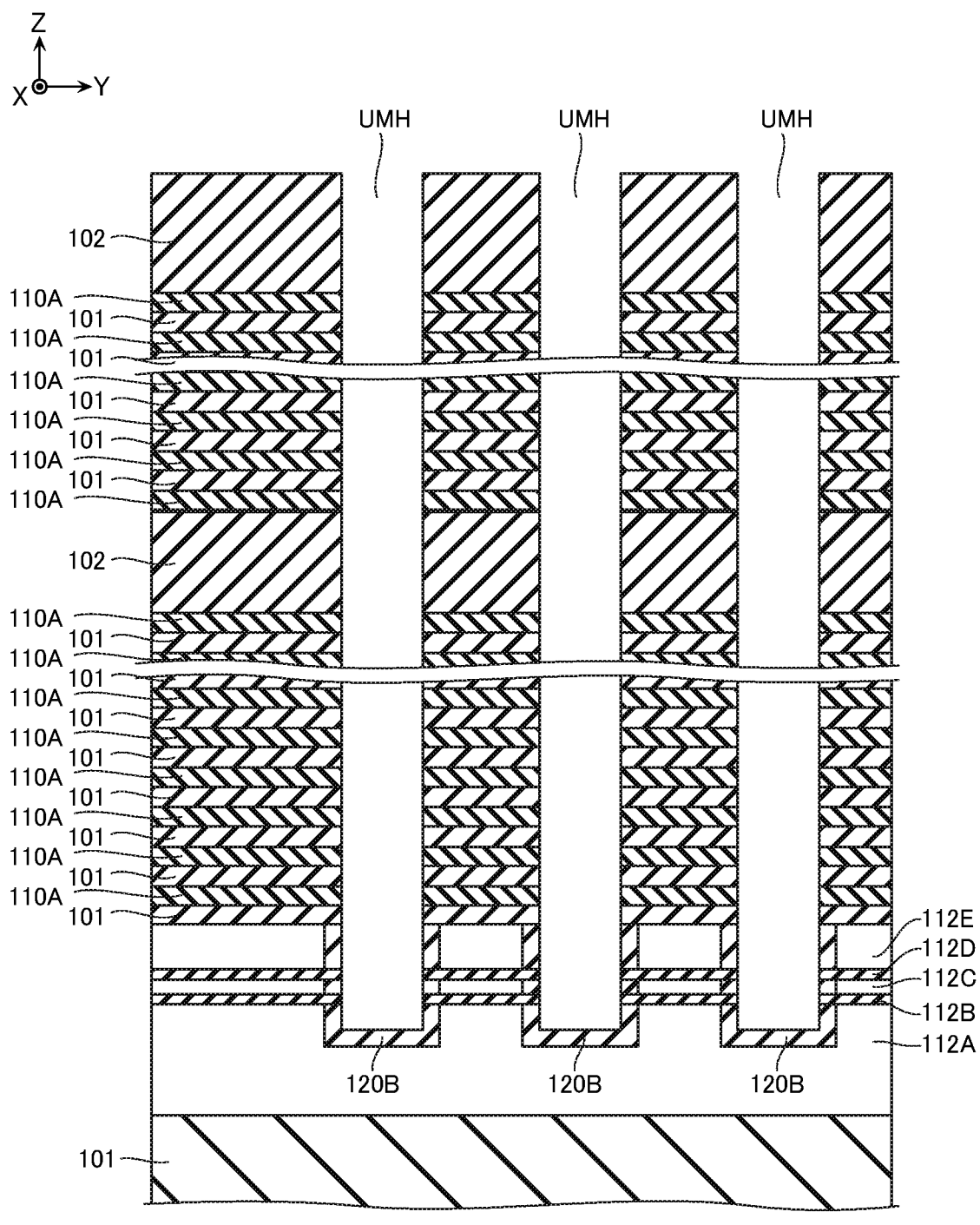
FIG. 19 is a schematic cross-sectional view illustrating the same manufacturing method.

Next, for example, as illustrated in FIG. 19, the sacrifice columns 120A are removed via the memory holes UMH. This process is, for example, performed by a method, such as wet etching.

Figure 20:
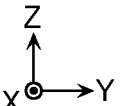
FIG. 20 is a schematic cross-sectional view illustrating the same manufacturing method.

Next, for example, as illustrated in FIG. 20, the gate insulating films 130, the semiconductor columns 120, and the insulating columns 125 are formed inside the plurality of memory holes LMH, UMH. This process is, for example, performed by CVD and RIE. Note that while the illustration is omitted, the plurality of support insulating columns HR may be formed in this process.

Figure 21:
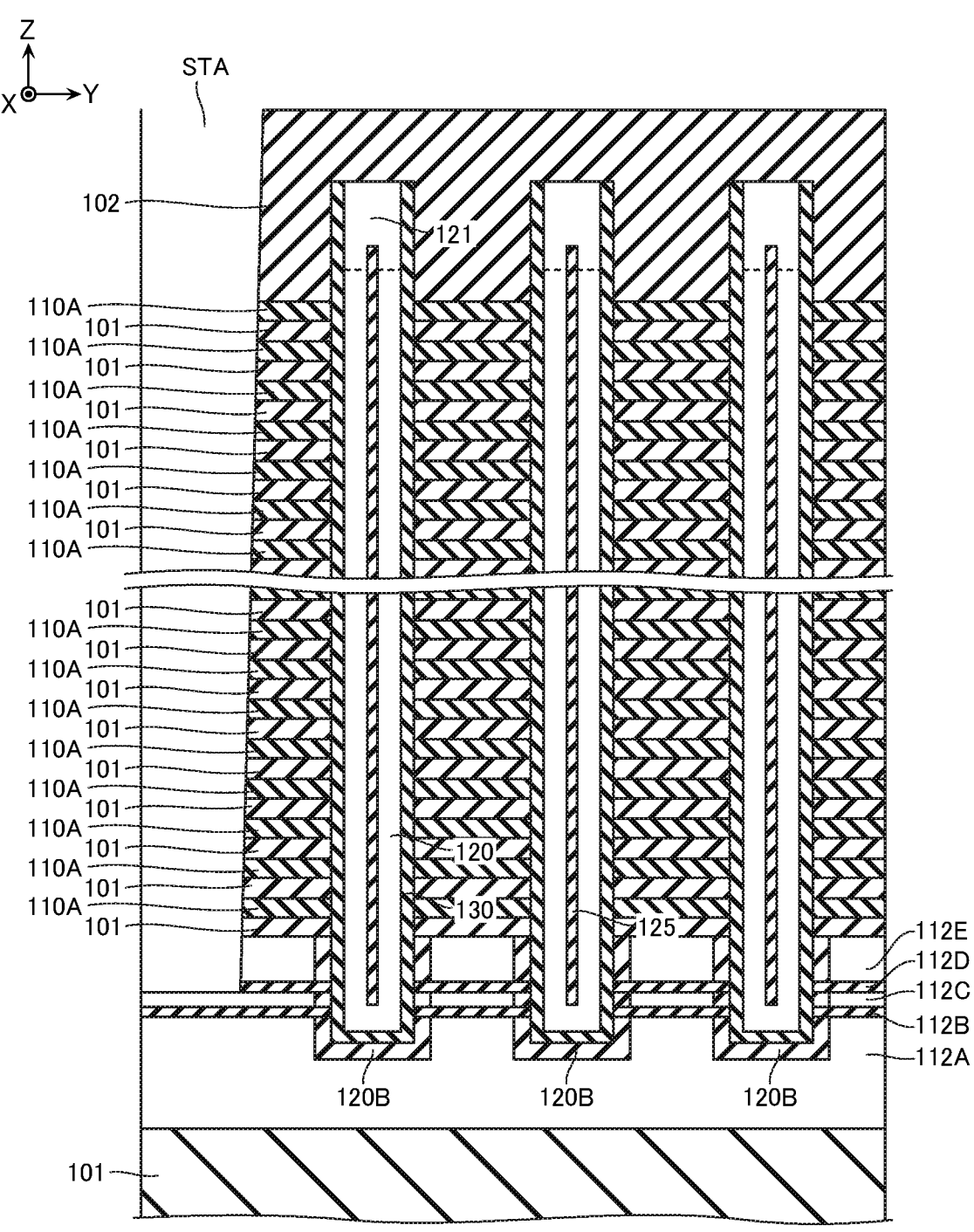
FIG. 21 is a schematic cross-sectional view illustrating the same manufacturing method.

Next, for example, as illustrated in FIG. 21, on an upper surface of the structure as illustrated in FIG. 20, the insulating layer 102 is further formed. This process is, for example, performed by a method, such as CVD. A trench STA is formed at a position corresponding to the inter-finger structure ST. The trench STA extends in the Z-direction and the X-direction, separates the insulating layer 102, the insulating layers 101 and the sacrifice layers 110A, the semiconductor layer 112E, and the sacrifice layer 112D in the Y-direction, and exposes the upper surface of the sacrifice layer 112C. This process is, for example, performed by a method, such as RIE.

Figure 22:
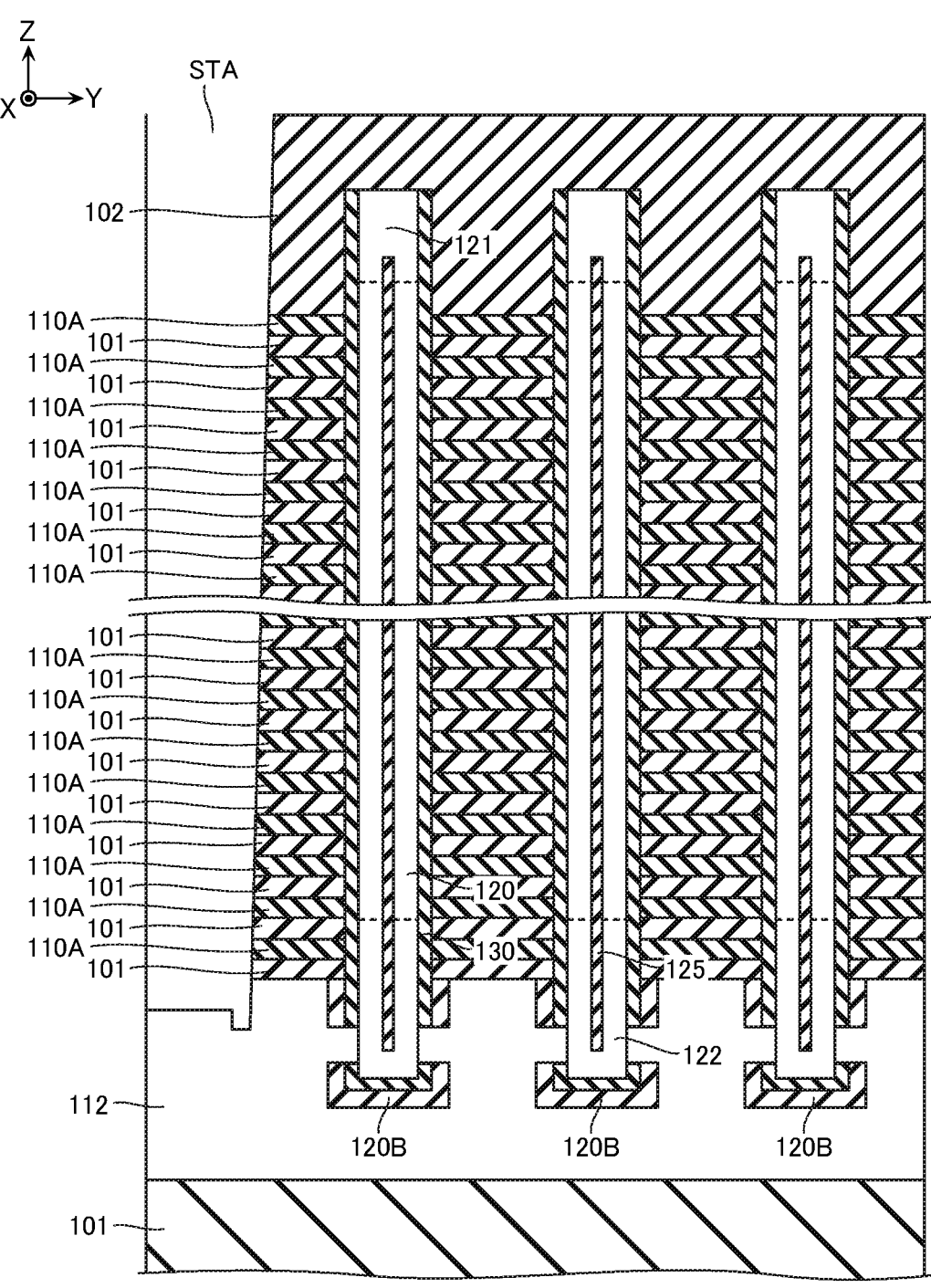
FIG. 22 is a schematic cross-sectional view illustrating the same manufacturing method.

Next, for example, as illustrated in FIG. 22, the wiring layer 112 is formed. In this process, for example, the sacrifice layers 112B, 112C, 112D are removed by a method, such as wet etching. Parts of the gate insulating films 130 are removed by a method, such as wet etching, to expose parts of the outer peripheral surfaces of the semiconductor columns 120. The wiring layer 112 is formed by a method, such as epitaxial growth.

Figure 23:
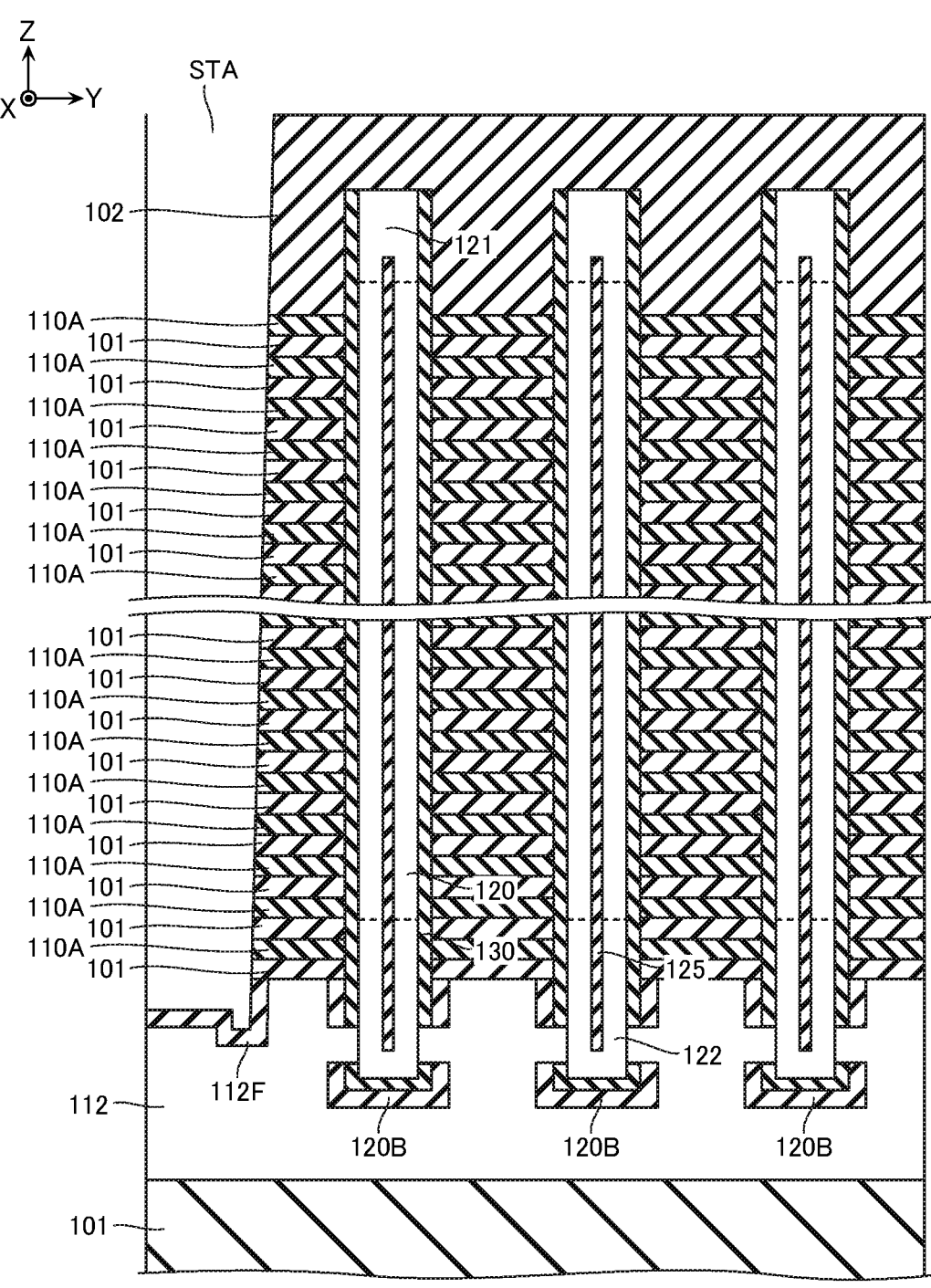
FIG. 23 is a schematic cross-sectional view illustrating the same manufacturing method.

Next, for example, as illustrated in FIG. 23, an oxidation process is performed on the wiring layer 112 via the trench STA to form an insulating layer 112F. This process is, for example, performed in the condition where silicon is oxidized easier than silicon nitride.

Figure 24:
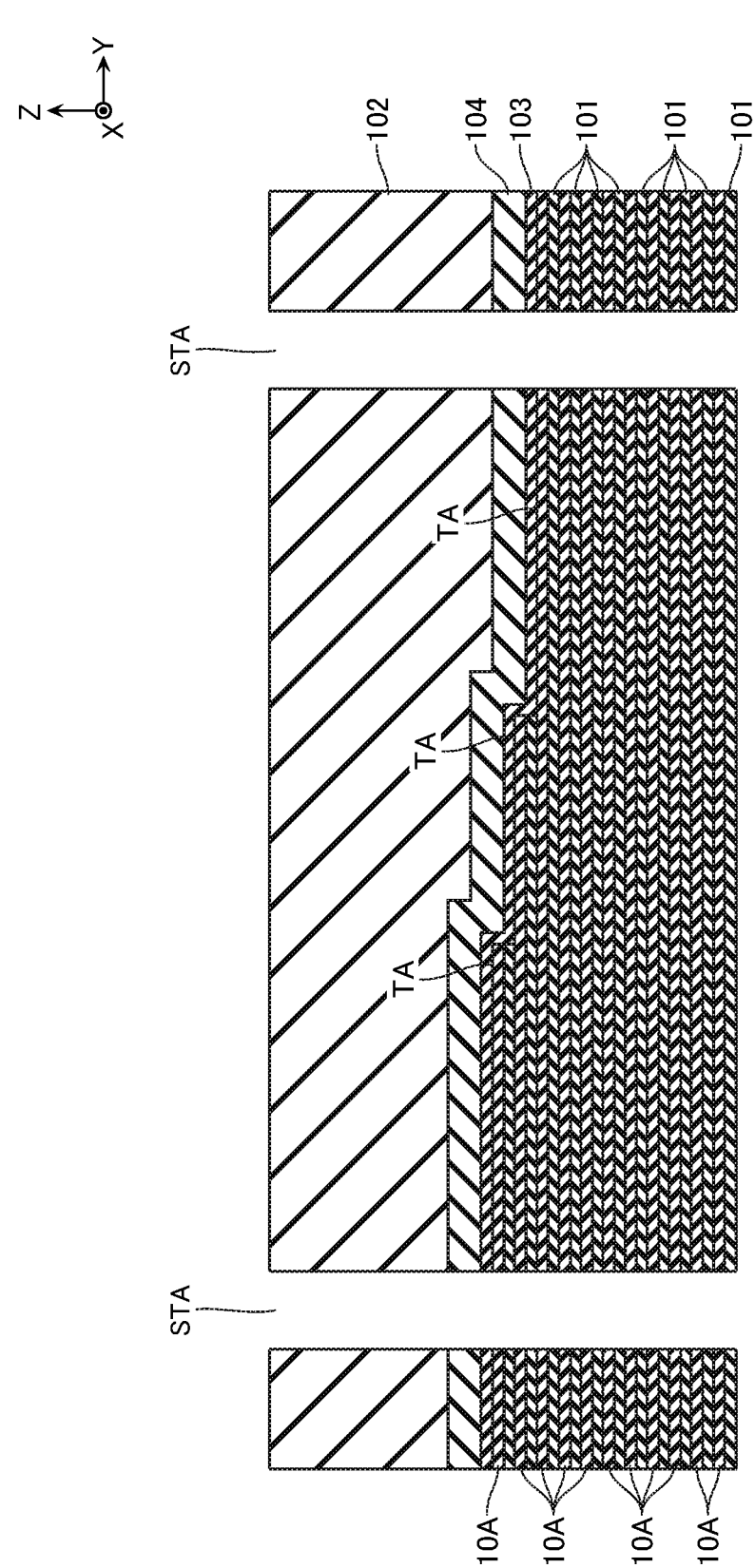
FIG. 24 is a schematic cross-sectional view illustrating the same manufacturing method.
Figure 25:
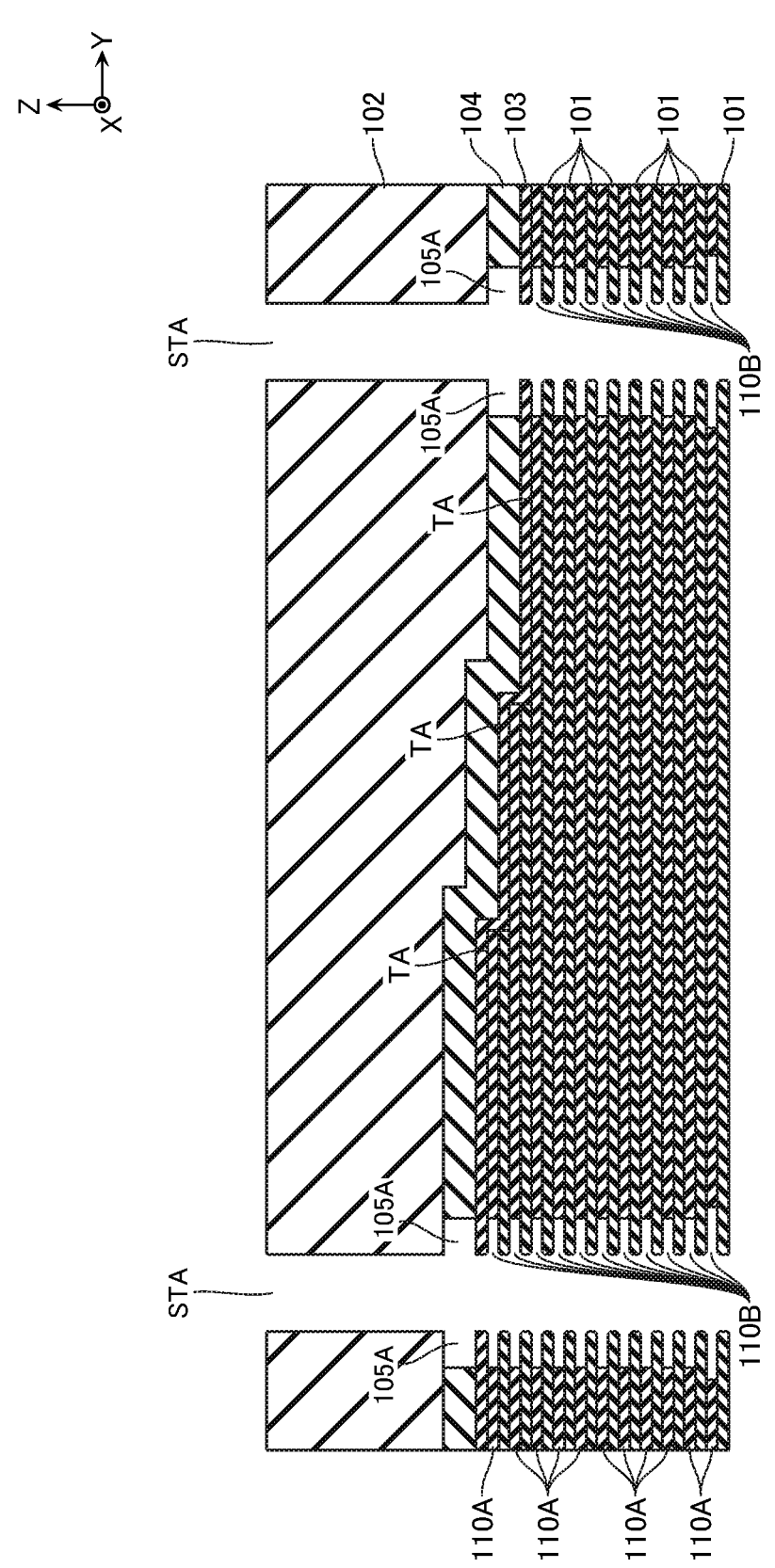
FIG. 25 is a schematic cross-sectional view illustrating the same manufacturing method.

Next, for example, as illustrated in FIG. 24 and FIG. 25, parts of the sacrifice layers 110A and the insulating layer 104 are removed via the trenches STA. In this process, the portions of the sacrifice layers 110A and the insulating layer 104 disposed within a constant distance range from the trenches STA are removed. This forms recessed portions 110B in regions where the sacrifice layers 110A were disposed. Recessed portions 105A are formed in regions where the insulating layer 104 was disposed. This process is, for example, performed by a method, such as wet etching. FIG. 25 illustrates an example in which an etching rate of parts of the sacrifice layers 110A disposed on a lower side are faster than an etching rate of other sacrifice layers 110A.

Note that the recessed portions 105A are formed on side surfaces on one side and the other side of the trenches STA in the Y-direction. These two recessed portions 105A are formed as a result of the insulating layer 104 being removed for the same period of time by the same chemical etchant or the like. Therefore, depths in the Y-direction of these two recessed portions 105A approximately match one another.

Figure 26:
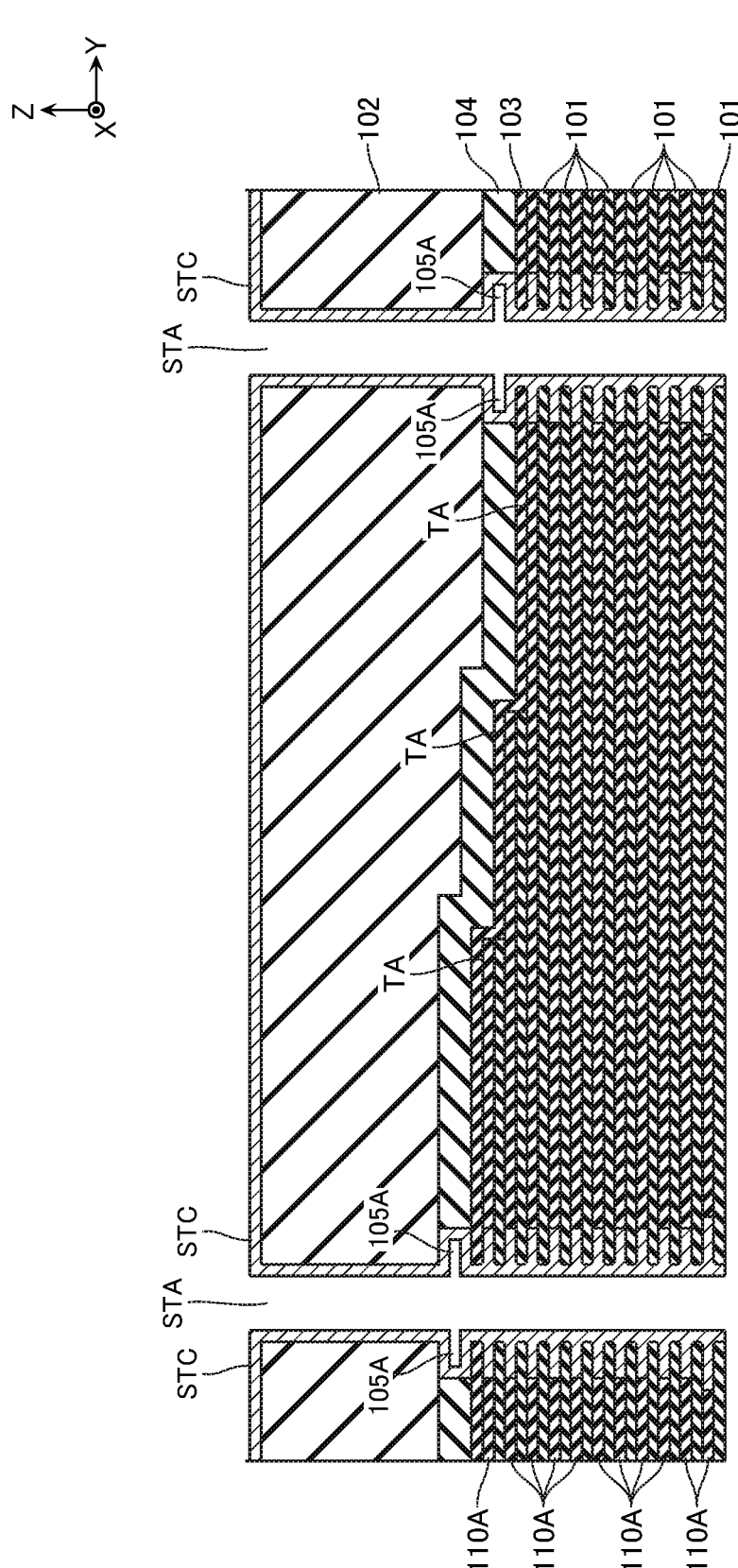
FIG. 26 is a schematic cross-sectional view illustrating the same manufacturing method.

Next, for example, as illustrated in FIG. 26, on an upper surface of the structure illustrated in FIG. 25 and on inner wall surfaces of the trenches STA, a sacrifice film STC is formed. While the illustration is omitted, the sacrifice film STC is also formed on bottom surfaces of the trenches STA. Here, the sacrifice film STC has a film thickness larger than a half of the film thickness of the sacrifice layer 110A. Therefore, the recessed portions 110B are filled with the sacrifice film STC. On the other hand, the film thickness of the sacrifice film STC is smaller than a half of the film thickness of the insulating layer 104. Therefore, the recessed portions 105A are not filled with the sacrifice film STC. Note that the sacrifice film STC may, for example, be a stacked film of titanium nitride (TiN) and tungsten (W).

Figure 27:
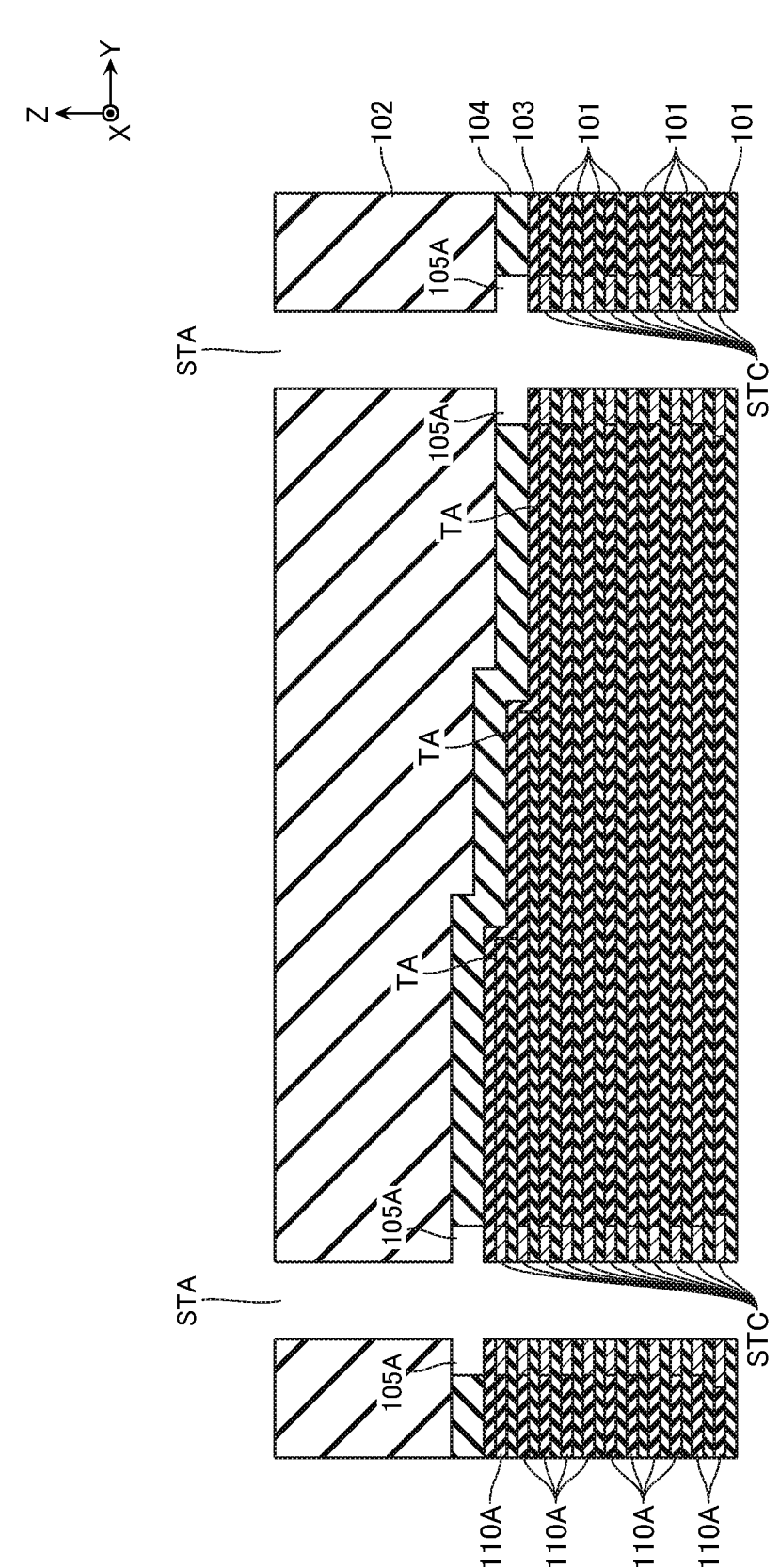
FIG. 27 is a schematic cross-sectional view illustrating the same manufacturing method.

Next, for example, as illustrated in FIG. 27, the sacrifice films STC are removed by leaving the portions formed in the above-described recessed portions 110B. This process is, for example, performed by a method, such as wet etching.

Figure 28:
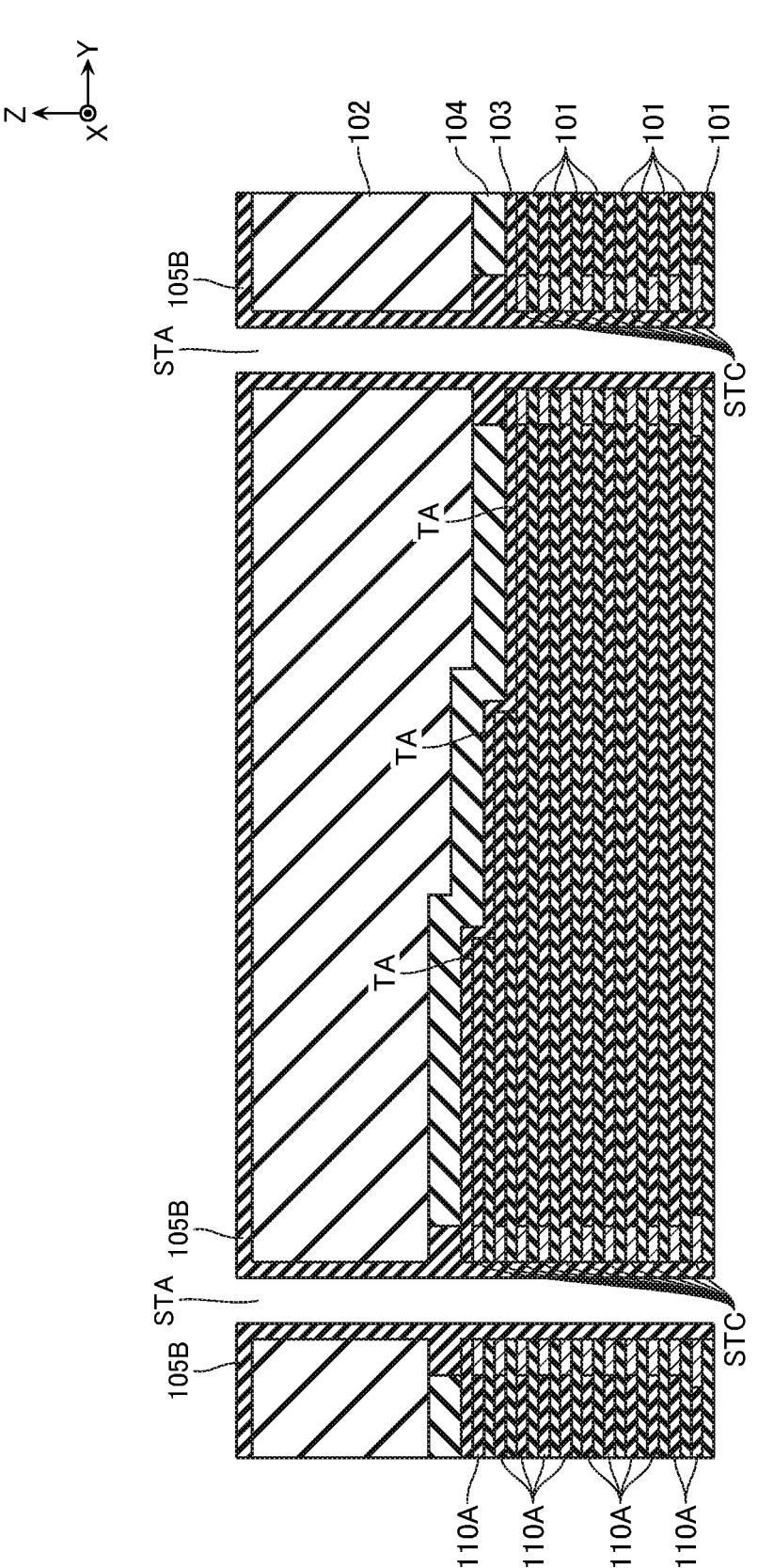
FIG. 28 is a schematic cross-sectional view illustrating the same manufacturing method.

Next, for example, as illustrated in FIG. 28, on an upper surface of the structure illustrated in FIG. 27 and on the inner wall surfaces of the trenches STA, an insulating film 105B of silicon oxide ($SiO_2$) or the like is formed. While the illustration is omitted, the insulating film 105B is formed on the bottom surfaces of the trenches STA. Here, the film thickness of the insulating film 105B is larger than a half of the film thickness of the insulating layer 104. Therefore, the recessed portions 105A are filled with the insulating film 105B. On the other hand, the film thickness of the insulating film 105B is smaller than a half of the width in the Y-direction of the trench STA. Therefore, the trenches STA are not filled with the insulating film 105B. This process is, for example, performed by a method, such as ALD (Atomic Layer Deposition).

Figure 29:
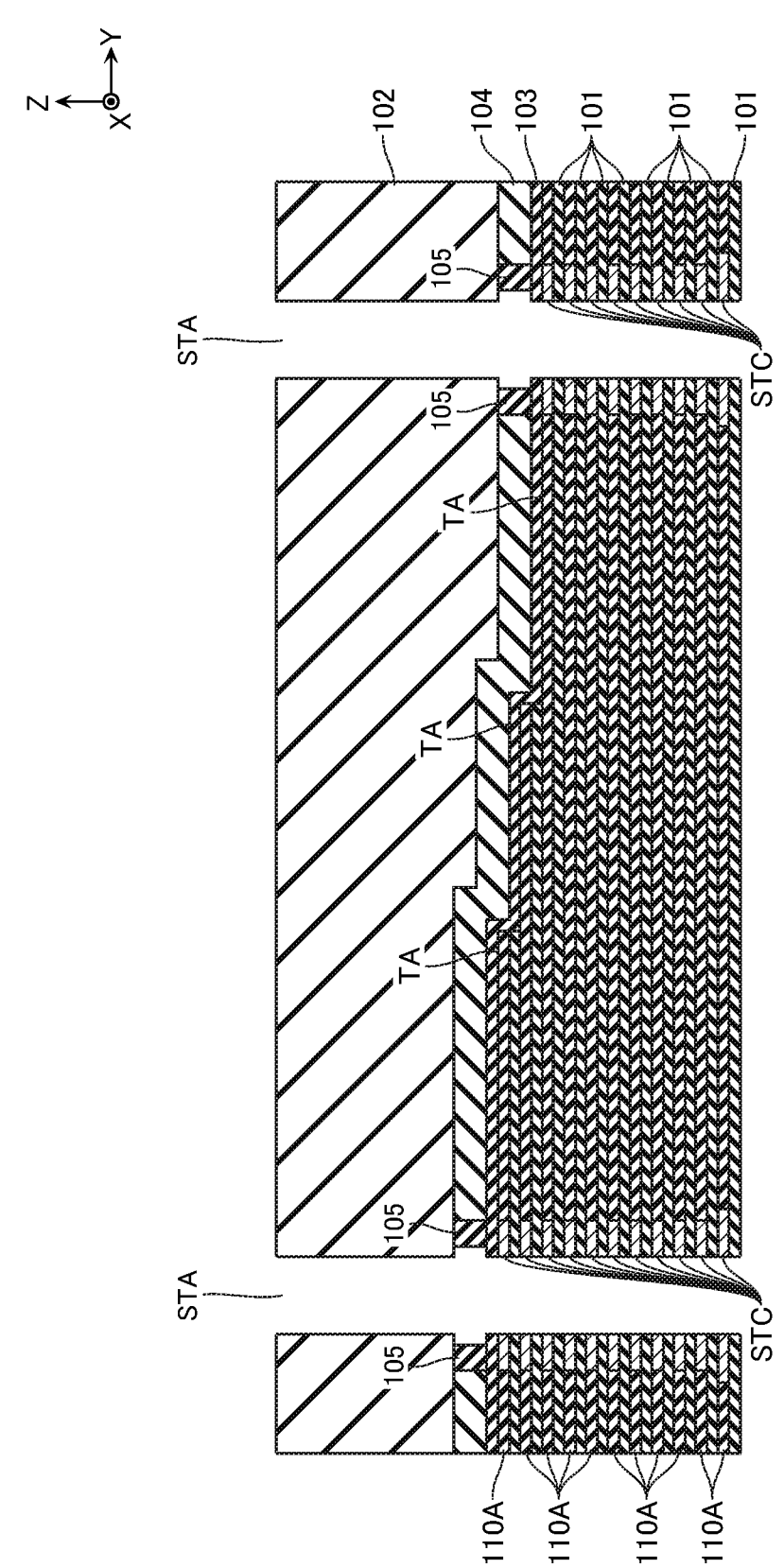
FIG. 29 is a schematic cross-sectional view illustrating the same manufacturing method.

Next, for example, as illustrated in FIG. 29, the insulating film 105B is removed while leaving the portions formed in the above-described recessed portions 105A. This process is, for example, performed by a method, such as wet etching. The portions of the insulating film 105B formed in the recessed portions 105A become the insulating layers 105.

Note that, in this embodiment, the insulating layers 101, 102, 103, and the insulating film 105B all contain silicon oxide ($SiO_2$). Therefore, it is considered that parts of the insulating layers 101, 102, 103 are also removed when the parts of the insulating film 105B are removed by a method, such as wet etching. Here, the insulating layers 101, 102, 103 and the insulating film 105B are formed in mutually different processes, thereby having mutually different etching rates. In the example in FIG. 29, the insulating film 105B has a higher etching rate than those of the insulating layers 101, 102, 103. As a result, the exposed surfaces of the insulating layers 105 exposed to the trenches STA are recessed with respect to the exposed surfaces of the insulating layers 101, 102, 103 exposed to the trenches STA.

The insulating layers 105 are formed on side surfaces on one side and the other side of the trenches STA in the Y-direction. These two insulating layers 105 are formed as a result of the insulating film 105B being removed for the same period of time by the same chemical etchant or the like. Therefore, the lengths in the Y-direction of these two insulating layers 105 (the length $L_{105}$ described with reference to FIG. 9) approximately match one another. The amounts that the exposed surface of the insulating layer 105 exposed to the trench STA is recessed with respect to the exposed surfaces of the insulating layers 101, 102, 103 exposed to the trench STA also approximately match between these two insulating layers 105. Therefore, the lengths $L_{105U}$, $L_{105L}$ (FIG. 9) corresponding to the side surface on one side in the Y-direction of the trench STA approximately match the lengths $L_{105U}$, $L_{105L}$ (FIG. 9) corresponding to the side surface on the other side in the Y-direction of the trench STA.

Figure 30:
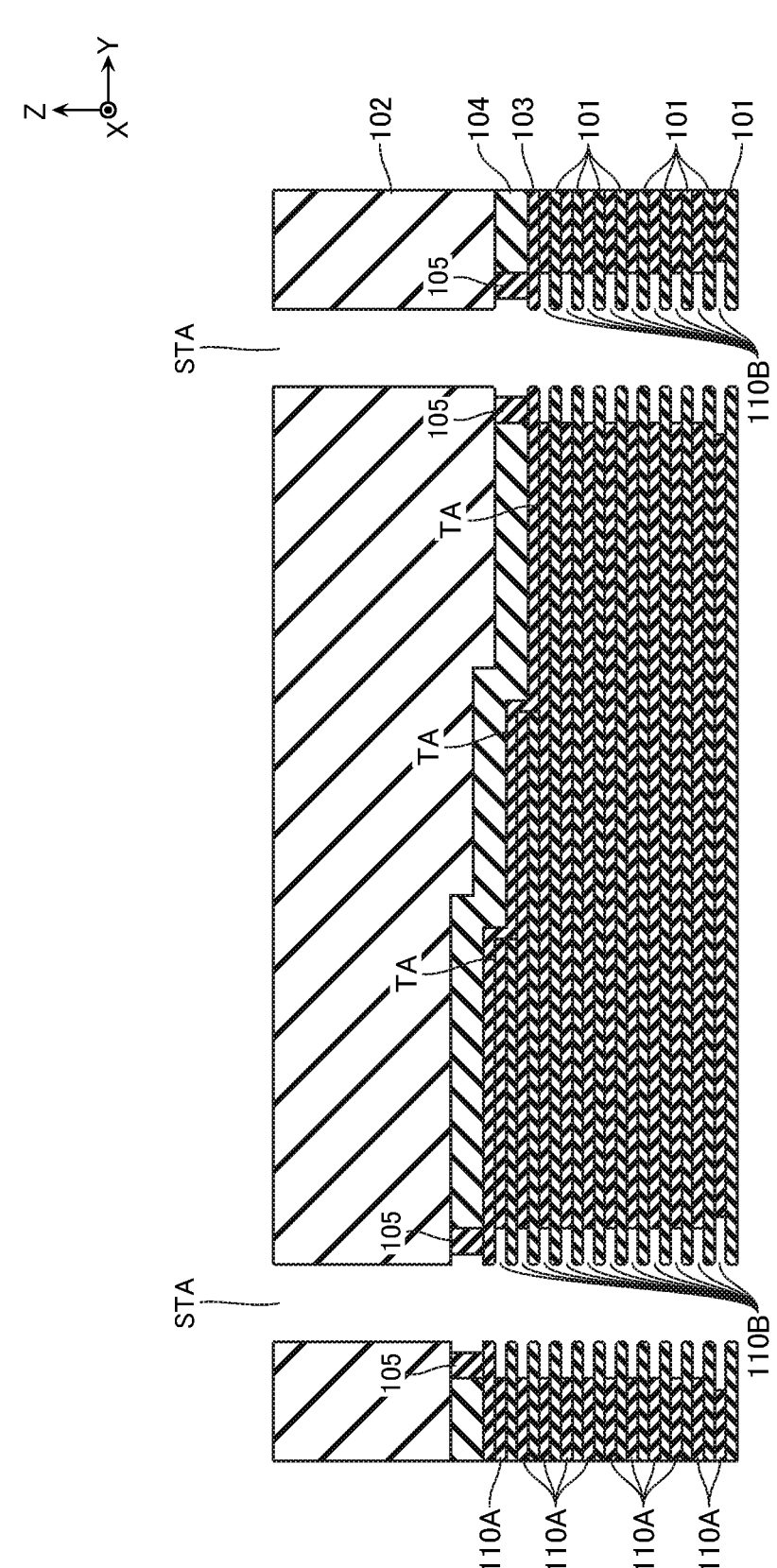
FIG. 30 is a schematic cross-sectional view illustrating the same manufacturing method.

Next, for example, as illustrated in FIG. 30, the sacrifice films STC are removed. This process is, for example, performed by a method, such as wet etching.

Figure 31:
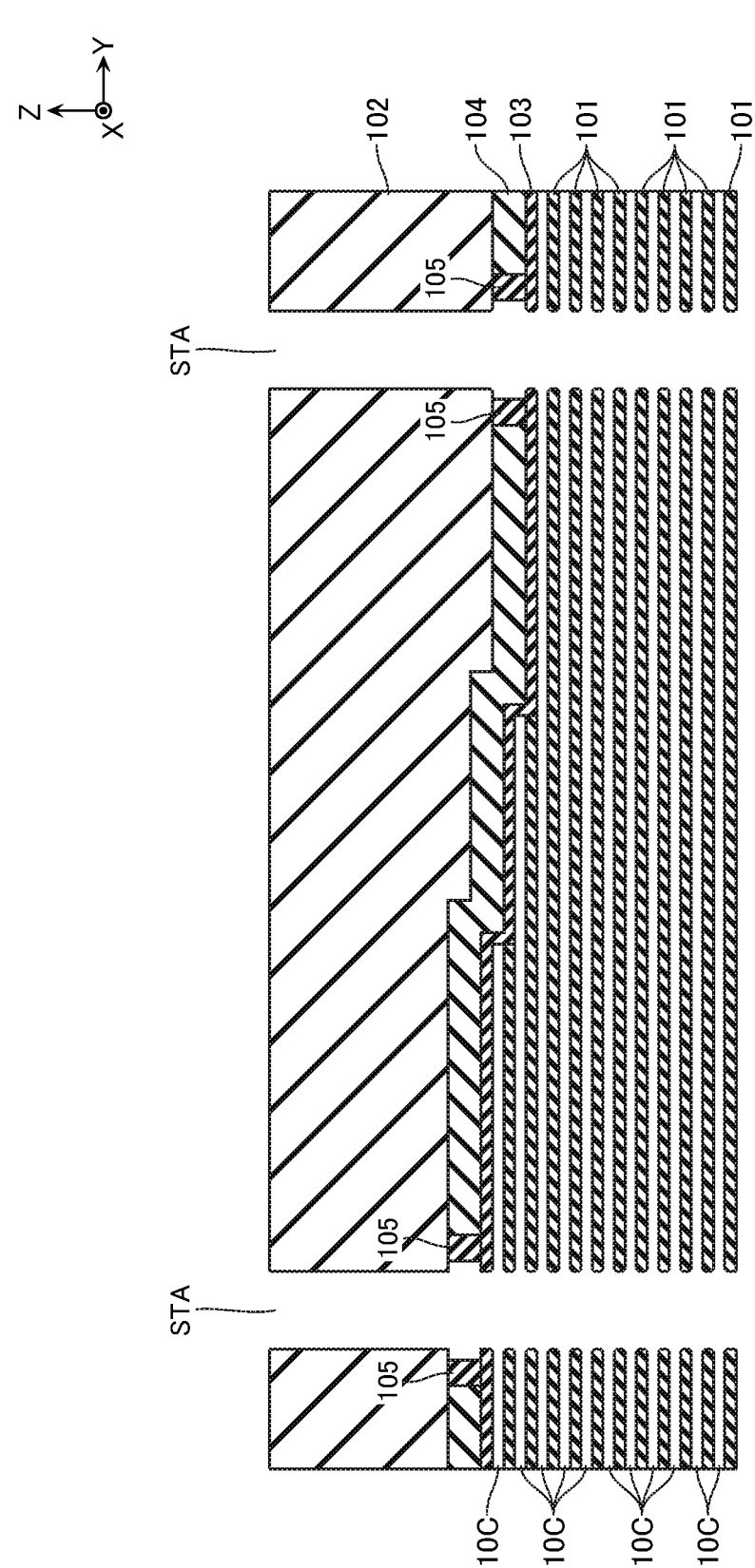
FIG. 31 is a schematic cross-sectional view illustrating the same manufacturing method.

Next, for example, as illustrated in FIG. 31, the sacrifice layers 110A are removed via the trenches STA. This forms a plurality of cavities 110C arranged in the Z-direction. In other words, a hollow structure including the plurality of insulating layers 101 arranged in the Z-direction and the structure supporting these insulating layers 101 is formed. In the memory hole region $R_{MH}$, the structures in the memory holes LMH, UMH (the semiconductor columns 120, the gate insulating films 130, and the insulating columns 125) support the insulating layers 101. In the hook-up region $R_{HU}$, the support insulating columns HR support the insulating layers 101. This process is, for example, performed by a method, such as wet etching.

Note that while the illustration is omitted, during the process described with reference to FIG. 29, the insulating layers 112F described with reference to FIG. 23 are removed in some cases. Therefore, when the process described with reference to FIG. 31 is executed, the process described with reference to FIG. 23 may be executed again in advance to form the insulating layers 112F. Note that, when the process described with reference to FIG. 23 is executed immediately before the process described with reference to FIG. 31, after the process described with reference to FIG. 22 is executed and before the process described with reference to FIG. 24 and FIG. 25 is executed, the process described with reference to FIG. 23 is not necessarily executed.

Figure 32:
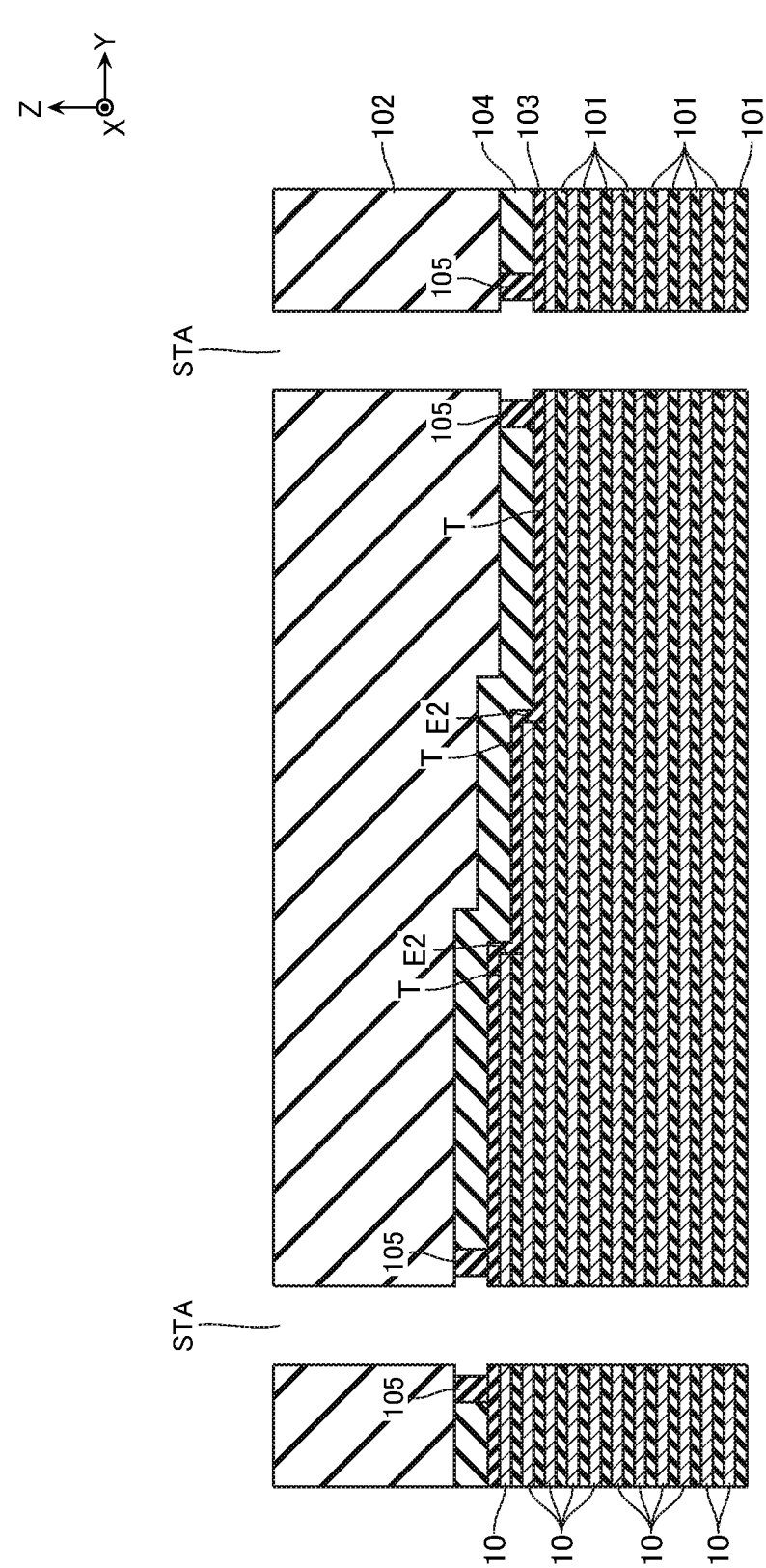
FIG. 32 is a schematic cross-sectional view illustrating the same manufacturing method.

Next, for example, as illustrated in FIG. 32, the plurality of conductive layers 110 are formed in the plurality of cavities 110C arranged in the Z-direction. This process is, for example, performed by a method, such as CVD. Note that, while the illustration is omitted in FIG. 32, the high-dielectric-constant insulating film 111 described with reference to FIG. 4 is formed before the conductive layers 110 are formed in the cavities 110C in this process.

Figure 33:
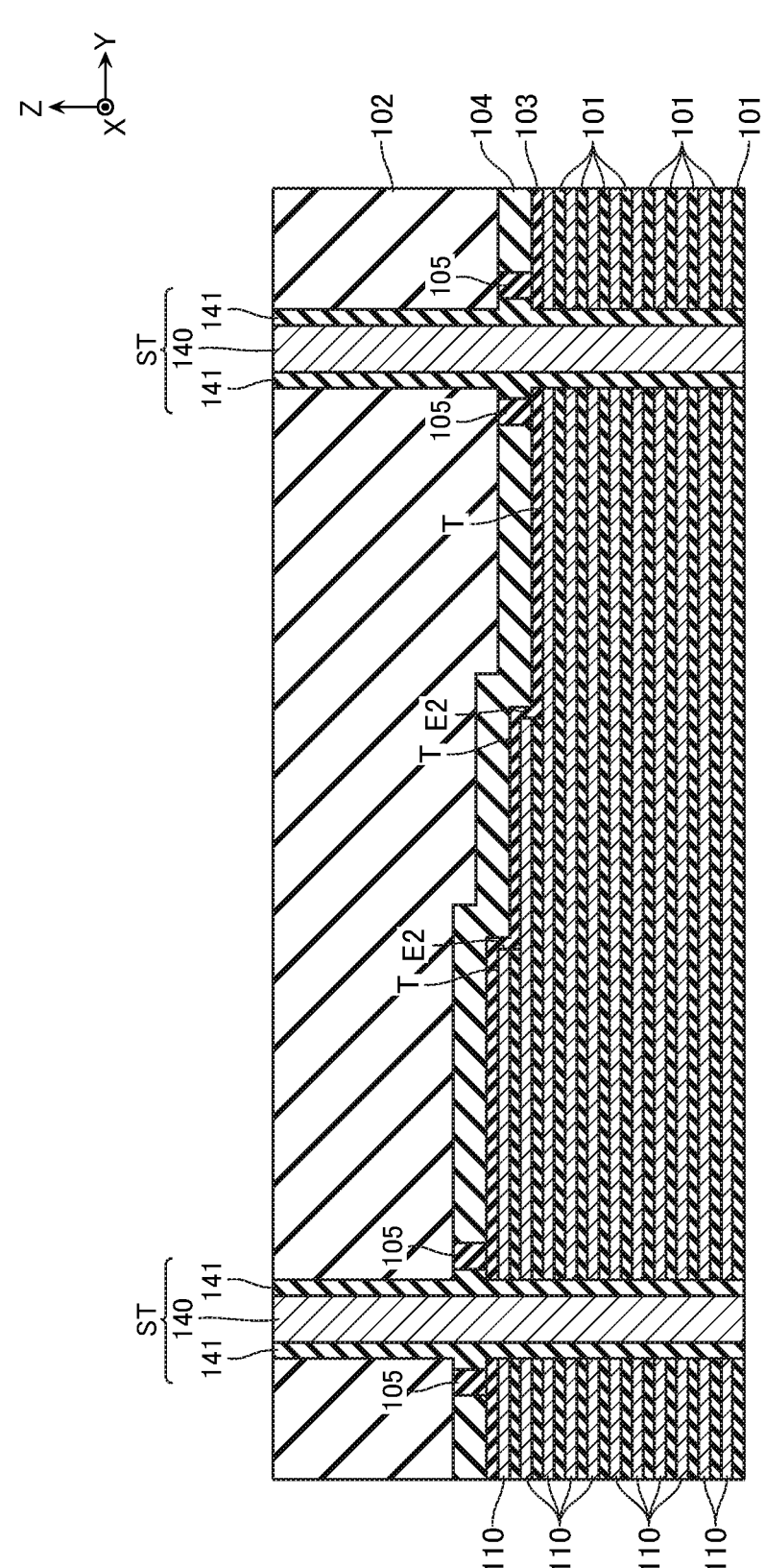
FIG. 33 is a schematic cross-sectional view illustrating the same manufacturing method.

Next, for example, as illustrated in FIG. 33, the inter-finger structures ST are formed inside the trenches STA. This process is, for example, performed by CVD and RIE. As illustrated in FIG. 3, the inter-string unit insulating members SHE that separate the one or plurality of conductive layers 110 (SGD) in the Y-direction are formed. This process is, for example, performed by CVD and RIE.

Next, for example, as illustrated in FIG. 34, a plurality of contact holes CCA are formed at positions corresponding to the plurality of via-contact electrodes CC. The contact holes CCA each extend in the Z-direction, pass through the insulating layer 102, and expose the upper surface of the insulating layer 104. This process is, for example, performed by a method, such as RIE.

Next, for example, as illustrated in FIG. 35, parts of the insulating layers 104, 103 are removed via the contact holes CCA to expose the terrace portions T of the conductive layers 110. This process is, for example, performed by a method, such as RIE.

Next, for example, as illustrated in FIG. 36, the via-contact electrodes CC are formed in the contact holes CCA. This process is, for example, performed by a method, such as CVD.

Thereafter, the via-contact electrodes Ch, Vy, bit lines BL, and the like described with reference to FIG. 2 are formed and individualized by dicing or the like, thereby forming the semiconductor memory device according to the first embodiment.

Comparative Example

Figure 37:
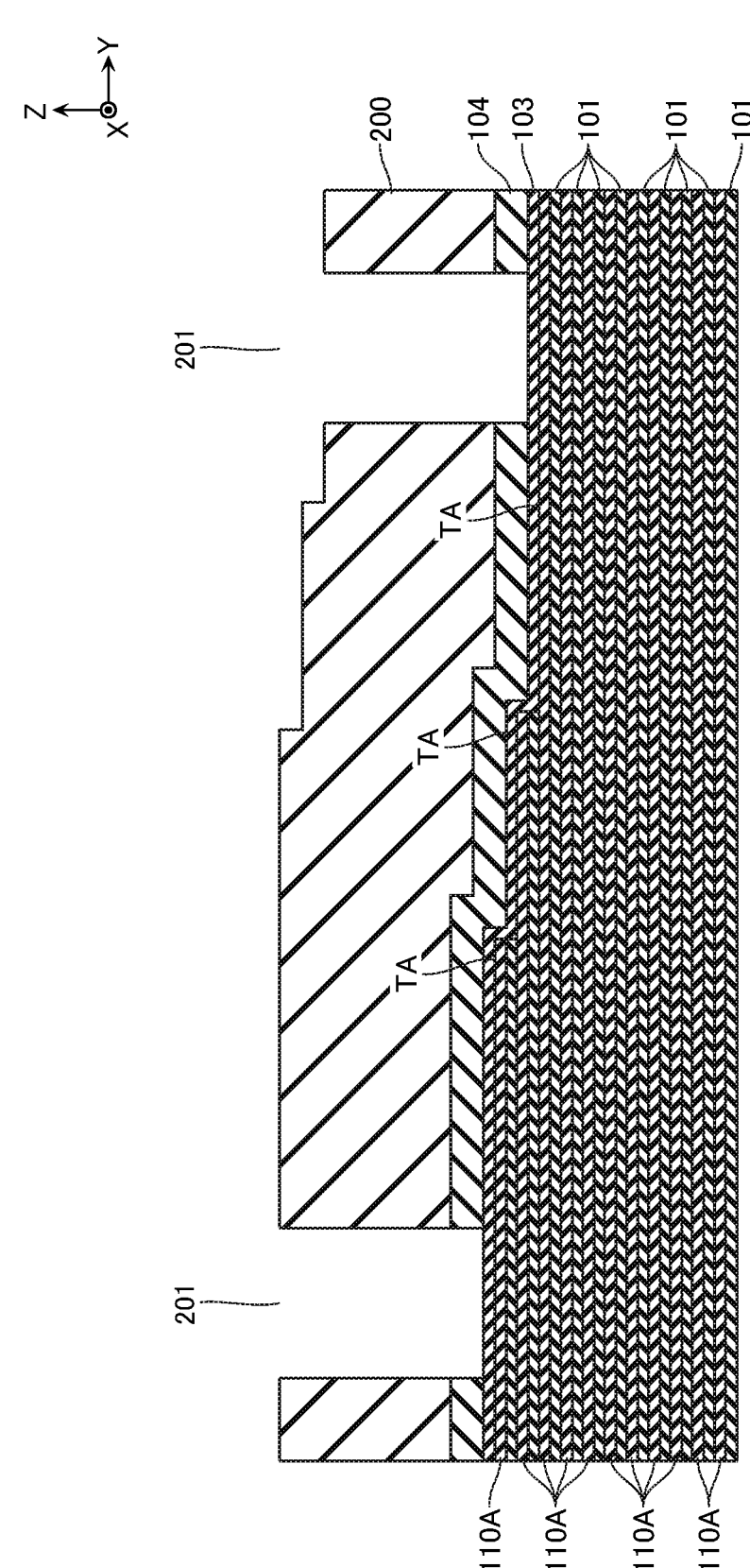
FIG. 37 is a schematic cross-sectional view illustrating a method for manufacturing a semiconductor memory device according to a comparative example.
Figure 38:
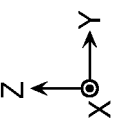
FIG. 38 is a schematic cross-sectional view illustrating the same manufacturing method.
Figure 38:
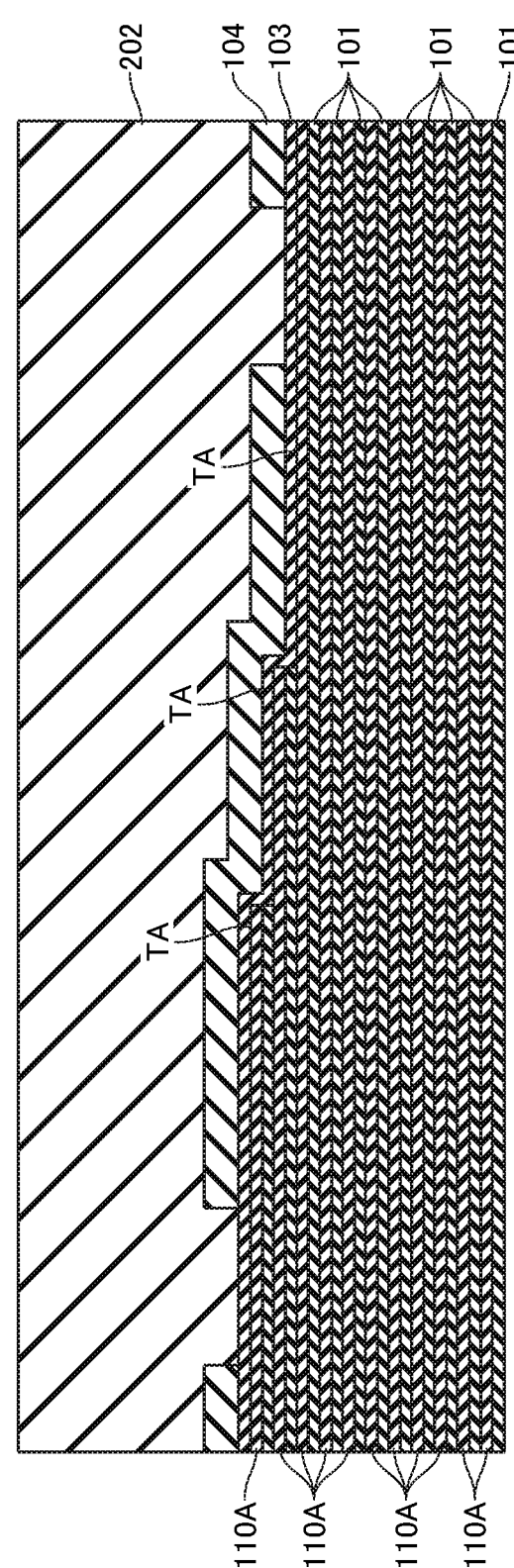

Next, with reference to FIG. 37 to FIG. 38, a method for manufacturing a semiconductor memory device according to a comparative example will be described. FIG. 37 to FIG. 38 are schematic cross-sectional views for describing the same manufacturing method.

In the method for manufacturing the semiconductor memory device according to the comparative example, the insulating layer 102 is not formed at the process corresponding to FIG. 13. After forming the insulating layer 104, as illustrated in FIG. 37, a resist 200 is formed on the upper surface of the insulating layer 104. At the proximities of regions corresponding to the inter-finger structures ST, trenches 201 are formed on the resist 200 by photolithography. The trench 201 separates the resist 200 in the Y-direction and exposes the upper surface of the insulating layer 104 at the proximity of the region corresponding to the inter-finger structure ST. Note that, while the illustration is omitted, in the comparative example, a portion of the resist 200 disposed in the memory hole region $R_{MH}$ is also removed.

Next, the exposed portions of the insulating layer 104 to the trenches 201 are removed. Thereafter, as illustrated in FIG. 38, the resist 200 is removed, and an insulating layer 202 of silicon oxide ($SiO_2$) or the like is formed.

In the method for manufacturing the semiconductor memory device according to the comparative example, also after executing the process corresponding to FIG. 17 and before executing the process corresponding to FIG. 18, the processes described with reference to FIG. 37 to FIG. 38 are executed.

In the method for manufacturing the semiconductor memory device according to the comparative example, the processes described with reference to FIG. 25 to FIG. 30 are not executed.

Effect

In association with highly stacking (that is, the increased number of conductive layers 110 stacked in the Z-direction) of the semiconductor memory device, a difference in lengths in the Z-direction of the via-contact electrodes CC (FIG. 6) is increased. That is, the difference between a Z-direction length of a via-contact electrode CC connected to a conductive layer 110 disposed on an upper side and a Z-direction length of a via-contact electrode CC connected to a conductive layer 110 disposed on a lower side is increased. In association with this, the difference in Z-direction length of the contact holes CCA formed in the process as described with reference to FIG. 34 is increased.

Contact holes CCA corresponding to parts of the conductive layers 110 are able to be formed in a short time compared with contact holes CCA corresponding to other conductive layers 110. Accordingly, without providing the insulating layer 104 functioning as an etching stopper, etching ions continue to collide on the terrace portions T of parts of the conductive layers 110 for a long period of time, which may cause parts of contact holes CCA to pass through the conductive layers 110. Therefore, in the comparative example, this is restrained by providing the insulating layer 104.

Here, in the comparative example, both the sacrifice layers 110A and the insulating layer 104 contain silicon nitride (SiN). Accordingly, in the process corresponding to FIG. 31, a process of removing the sacrifice layers 110A with the insulating layer 104 protected is executed.

That is, in the comparative example, the parts of the insulating layer 104 (the portions formed at the proximities of the regions corresponding to the inter-finger structures ST) are removed in the process described with reference to FIG. 37. With such a method, the end portions in the Y-direction of the insulating layer 104 are protected by the insulating layer 202 (FIG. 38) in the process corresponding to FIG. 31, thereby ensuring restraining the insulating layer 104 from exposing to the trenches STA. Accordingly, the sacrifice layers 110A can be removed with the insulating layer 104 protected.

On the other hand, with such a method, when a positional misalignment of the trench 201 formed on the resist 200 occurs in the process described with reference to FIG. 37, the insulating layer 104 may be exposed to the trenches STA in the process corresponding to FIG. 24 to cause the removal of the insulating layer 104 in the process corresponding to FIG. 31. In order to avoid this, it is only necessary to cause the trenches 201 (FIG. 37) to have a process margin to form the trench 201 across a wide range. With such a method, the width of the finger structure FS in the Y-direction is, however, increased, and therefore, the high integration of the semiconductor memory device is interfered.

In the process described with reference to FIG. 37, the plurality of terrace portions TA are formed in the hook-up region $R_{HU}$. Accordingly, on upper surfaces of the insulating layer 104 and the resist 200 covering the upper surfaces of these plurality of terrace portions TA, differences in height corresponding to height positions of the plurality of terrace portions TA are formed. Accordingly, there is a concern of varied widths of the trench 201 in the Y-direction as focusing on the resist 200 during the photolithography process corresponding to FIG. 37 is difficult. From such a reason, the increased width of the trench 201 in the Y-direction is caused.

There also is a necessity of executing the process of photolithography corresponding to FIG. 37 twice, thereby leading to an increased manufacturing cost.

In order to reduce the number of processes of such photolithography, for example, the method as follows is conceivable. For example, after executing the process described with reference to FIG. 10 and before executing the process described with reference to FIG. 15, the processes described with reference to FIG. 12 to FIG. 14 and FIG. 37 and FIG. 38 are not executed. After executing the process described with reference to FIG. 17 and before executing the process described with reference to FIG. 18, the process described with reference to FIG. 12 is executed to collectively form the plurality of terrace portions TA of the sacrifice layers 110A corresponding to the memory cell array layers $L_{MCL}$, $L_{MCU}$. Next, the insulating layers 103, 104 that cover these plurality of terrace portions TA are formed, and the processes described with reference to FIG. 37 and FIG. 38 are executed.

With such a method, a process of the photolithography corresponding to FIG. 37 can be reduced to once. In such a method, however, the differences in height corresponding to the height positions of the plurality of terrace portions TA further increase, thereby leading to further increased width of the trench 201 in the Y-direction to interfere the high integration of the semiconductor memory device.

As described above, in the comparative example, the portions of the resist 200 provided in the memory hole region $R_{MH}$ are removed in the process described with reference to FIG. 37. This may form differences in level on the upper surface of the structure between the memory hole region $R_{MH}$ and the hook-up region $R_{HU}$ in the comparative example. There is also a concern of wiring materials, such as metals, remaining in such a level difference in a damascene process and the like to be a cause of a failure.

Therefore, in the first embodiment, the recessed portions 110B are formed at height positions corresponding to the sacrifice layers 110A and the recessed portions 105A at height positions corresponding to the insulating layers 104 on the inner wall surfaces of the trenches STA in the process described with reference to FIG. 25. In the processes described with reference to FIG. 26 and FIG. 27, the sacrifice film STC is filled in the recessed portions 110B and the recessed portions 105A are exposed to the trenches STA by using the difference between a thickness of the sacrifice layer 110A and a thickness of the insulating layer 104. The insulating layers 105 are formed in the recessed portions 105A in the processes described with reference to FIG. 28 and FIG. 29, and the sacrifice films STC are removed in the process described with reference to FIG. 30, thereby ensuring removing the sacrifice layers 110A with the insulating layers 104 protected in the process described with reference to FIG. 31.

With such a method, the positions of the recessed portions 105A (FIG. 25) are self-conformably adjustable with the trenches STA, and therefore, without the necessity of proving the process margin as described above, the increase of the width of the finger structure FS in the Y-direction can be restrained.

Since there is no necessity of executing the photolithography on the resist 200 (FIG. 37) having the difference in height on the upper surface, the variation of the widths of the trenches 201 in the Y-direction can be restrained.

Since the flattening process is executed in the process described with reference to FIG. 14, the generation of the level difference on the upper surface of the structure can be restrained.

In the first embodiment, the sacrifice film STC is filled in the recessed portions 110B and the recessed portions 105A are exposed to the trenches STA by using the difference between the thickness of the sacrifice layer 110A and the thickness of the insulating layer 104 in the process described with reference to FIG. 26 and FIG. 27. Here, as the high integration of the semiconductor memory device proceeds, it is considered that thinning of the sacrifice layer 110A and thickening of the insulating layer 104 proceed. Accordingly, the semiconductor memory device according to the first embodiment is more preferably manufacturable in association with high integration.

Others

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate extending in a first direction and a second direction intersecting with the first direction;
a plurality of finger structures arranged in the first direction and including a first region and a second region arranged in the second direction; and
an inter-finger insulating member disposed between a first finger structure and a second finger structure adjacent to one another in the first direction among the plurality of finger structures, wherein
the first finger structure includes:
a plurality of conductive layers stacked in a stacking direction intersecting with a surface of the substrate and extending in the second direction across the first region and the second region;
a semiconductor column disposed in the first region, extending in the stacking direction, and opposed to the plurality of conductive layers;
an electric charge accumulating film disposed between the plurality of conductive layers and the semiconductor column;
a plurality of via-contact electrodes disposed in the second region, extending in the stacking direction, and connected to a plurality of terrace portions of the plurality of conductive layers;
a first insulating layer covering the plurality of terrace portions and surrounding outer peripheral surfaces of the plurality of via-contact electrodes;
a second insulating layer covering the plurality of terrace portions via the first insulating layer and surrounding the outer peripheral surfaces of the plurality of via-contact electrodes; and
a third insulating layer disposed between the first insulating layer and the inter-finger insulating member in the first direction,
the second insulating layer and the third insulating layer have mutually same main components,
at least a part of a main component of the first insulating layer is different from the main components of the second insulating layer and the third insulating layer, and
the second insulating layer and the third insulating layer have mutually different etching rates.

2. The semiconductor memory device according to claim 1, wherein
the third insulating layer has a higher etching rate than an etching rate of the second insulating layer.

3. The semiconductor memory device according to claim 1, wherein
the first insulating layer and the third insulating layer are disposed at positions overlapping the second insulating layer viewing from the stacking direction.

4. The semiconductor memory device according to claim 1, wherein
the first insulating layer contains silicon (Si) and nitrogen (N) as main components, and the second insulating layer and the third insulating layer contain silicon (Si) and oxygen (O) as main components.

5. The semiconductor memory device according to claim 1, wherein
the first finger structure further includes a fourth insulating layer covering the plurality of terrace portions and surrounding the outer peripheral surfaces of the plurality of via-contact electrodes,
the first insulating layer covers the plurality of terrace portions via the fourth insulating layer,
the third insulating layer and the fourth insulating layer have mutually same main components, and
the third insulating layer and the fourth insulating layer have mutually different etching rates.

6. The semiconductor memory device according to claim 5, wherein
the first insulating layer contains silicon (Si) and nitrogen (N) as main components, and
the second insulating layer, the third insulating layer, and the fourth insulating layer contain silicon (Si) and oxygen (O) as main components.

7. A semiconductor memory device comprising:
a substrate extending in a first direction and a second direction intersecting with the first direction;
a plurality of finger structures arranged in the first direction and including a first region and a second region arranged in the second direction; and
an inter-finger insulating member disposed between a first finger structure and a second finger structure adjacent to one another in the first direction among the plurality of finger structures, wherein
the first finger structure includes:
a plurality of first conductive layers stacked in a stacking direction intersecting with a surface of the substrate and extending in the second direction across the first region and the second region;
a first semiconductor column disposed in the first region, extending in the stacking direction, and opposed to the plurality of first conductive layers;
a first electric charge accumulating film disposed between the plurality of first conductive layers and the first semiconductor column;
a plurality of first via-contact electrodes disposed in the second region, extending in the stacking direction, and connected to a plurality of terrace portions of the plurality of first conductive layers; and
a first insulator structure covering the plurality of terrace portions and surrounding outer peripheral surfaces of the plurality of first via-contact electrodes,
a surface on a side of the second finger structure in the first direction of the first insulator structure includes:
a first part extending in the stacking direction along the inter-finger insulating member; and
a second part disposed between the first part and the plurality of first conductive layers, and
a first end portion on an opposite side of the plurality of first conductive layers in the stacking direction of the second part is disposed at a position farther from the second finger structure in the first direction than a second end portion on a side of the plurality of first conductive layers in the stacking direction of the first part.

8. The semiconductor memory device according to claim 7, wherein
the first insulator structure comprises:

a first insulating layer covering the plurality of terrace portions and surrounding the outer peripheral surfaces of the plurality of first via-contact electrodes;

a second insulating layer covering the plurality of terrace portions via the first insulating layer and surrounding the outer peripheral surfaces of the plurality of first via-contact electrodes; and a third insulating layer disposed between the first insulating layer and the inter-finger insulating member in the first direction, the second insulating layer and the third insulating layer have mutually same main components, at least a part of a main component of the first insulating layer is different from the main components of the second insulating layer and the third insulating layer, and the second insulating layer and the third insulating layer have mutually different etching rates.

9. The semiconductor memory device according to claim 8, wherein the third insulating layer has a higher etching rate than an etching rate of the second insulating layer.

10. The semiconductor memory device according to claim 8, wherein the first insulating layer and the third insulating layer are disposed at positions overlapping the second insulating layer viewing from the stacking direction.

11. The semiconductor memory device according to claim 8, wherein the first insulating layer contains silicon (Si) and nitrogen (N) as main components, and the second insulating layer and the third insulating layer contain silicon (Si) and oxygen (O) as main components.

12. The semiconductor memory device according to claim 8, wherein a surface on the side of the second finger structure in the first direction of the second insulating layer is the first part, and a surface on the side of the second finger structure in the first direction of the third insulating layer is the second part.

13. The semiconductor memory device according to claim 7, wherein a surface on a side of the first finger structure in the first direction of the inter-finger insulating member includes:

a third part disposed at a position in the stacking direction corresponding to the first part; and a fourth part disposed at a position in the stacking direction corresponding to the second part, and an end portion on the opposite side of the plurality of first conductive layers in the stacking direction of the fourth part is disposed at a position farther from the second finger structure in the first direction than an end portion on the side of the plurality of first conductive layers in the stacking direction of the third part.

14. The semiconductor memory device according to claim 7, wherein the surface on the side of the second finger structure in the first direction of the first insulator structure further includes a fifth part disposed between the second part and the plurality of first conductive layers, and an end portion on the side of the plurality of first conductive layers in the stacking direction of the second part is disposed at a position farther from the second finger structure in the first direction than an end portion on the opposite side of the plurality of first conductive layers in the stacking direction of the fifth part.

15. The semiconductor memory device according to claim 14, wherein the first insulator structure comprises:

a first insulating layer covering the plurality of terrace portions and surrounding the outer peripheral surfaces of the plurality of first via-contact electrodes;

a second insulating layer covering the plurality of terrace portions via the first insulating layer and surrounding the outer peripheral surfaces of the plurality of first via-contact electrodes;

a third insulating layer disposed between the first insulating layer and the inter-finger insulating member in the first direction; and a fourth insulating layer covering the plurality of terrace portions and surrounding the outer peripheral surfaces of the plurality of first via-contact electrodes, the first insulating layer covers the plurality of terrace portions via the fourth insulating layer, the second insulating layer, the third insulating layer, and the fourth insulating layer have mutually same main components, the second insulating layer and the third insulating layer have mutually different etching rates, and the third insulating layer and the fourth insulating layer have mutually different etching rates.

16. The semiconductor memory device according to claim 15, wherein the first insulating layer contains silicon (Si) and nitrogen (N) as main components, and the second insulating layer, the third insulating layer, and the fourth insulating layer contain silicon (Si) and oxygen (O) as main components.

17. The semiconductor memory device according to claim 15, wherein a surface on the side of the second finger structure in the first direction of the second insulating layer is the first part, a surface on the side of the second finger structure in the first direction of the third insulating layer is the second part, and a surface on the side of the second finger structure in the first direction of the fourth insulating layer is the fifth part.

18. The semiconductor memory device according to claim 14, wherein a surface on a side of the first finger structure in the first direction of the inter-finger insulating member includes:

a third part disposed at a position in the stacking direction corresponding to the first part;

a fourth part disposed at a position in the stacking direction corresponding to the second part; and a sixth part disposed at a position in the stacking direction corresponding to the fifth part, an end portion on the opposite side of the plurality of first conductive layers in the stacking direction of the fourth part is disposed at a position farther from the second finger structure in the first direction than an end portion on the side of the plurality of first conductive layers in the stacking direction of the third part, and an end portion on the side of the plurality of first conductive layers in the stacking direction of the fourth part is disposed at a position farther from the second finger structure in the first direction than an end portion on the opposite side of the plurality of first conductive layers in the stacking direction of the sixth part.

19. The semiconductor memory device according to claim 7, wherein the second finger structure includes:

a plurality of second conductive layers stacked in the stacking direction and extending in the second direction across the first region and the second region;

a second semiconductor column disposed in the first region, extending in the stacking direction, and opposed to the plurality of second conductive layers;

a second electric charge accumulating film disposed between the plurality of second conductive layers and the second semiconductor column; and a second insulator structure covering a plurality of terrace portions of the plurality of second conductive layers, a surface on a side of the first finger structure in the first direction of the second insulator structure includes:

a seventh part extending in the stacking direction along the inter-finger insulating member; and an eighth part disposed between the seventh part and the plurality of second conductive layers, a third end portion on an opposite side of the plurality of second conductive layers in the stacking direction of the eighth part is disposed at a position farther from the first finger structure in the first direction than a fourth end portion on a side of the plurality of second conductive layers in the stacking direction of the seventh part, and a length from the first end portion to the second end portion in the first direction approximately matches a length from the third end portion to the fourth end portion in the first direction.

20. The semiconductor memory device according to claim 19, wherein the first insulator structure comprises:

a first insulating layer covering the plurality of terrace portions of the plurality of first conductive layers and surrounding the outer peripheral surfaces of the plurality of first via-contact electrodes; and a third insulating layer disposed between the first insulating layer and the inter-finger insulating member in the first direction, the second insulator structure comprises:

a fifth insulating layer covering the plurality of terrace portions of the plurality of second conductive layers; and a sixth insulating layer disposed between the fifth insulating layer and the inter-finger insulating member in the first direction, and a length in the first direction of the third insulating layer approximately matches a length in the first direction of the sixth insulating layer.

\* \* \* \* \*